(12) United States Patent
Rhodes et al.

(10) Patent No.: US 6,949,609 B2
(45) Date of Patent: Sep. 27, 2005

(54) POLYMERIC COMPOSITIONS AND USES THEREFOR

(75) Inventors: Larry F. Rhodes, Silver Lake, OH (US); Richard Vicari, Pasadena, TX (US); Leah J. Langsdorf, Akron, OH (US); Andrew A. Sobek, Fairlawn, OH (US); Edwin P. Boyd, Clinton, OH (US); Brian Bennett, Brecksville, OH (US)

(73) Assignee: Sumitomo Bakelite Co., Ltd., Tokyo (JP)

( * ) Notice: Subject to any disclaimer, the term of this patent is extended or adjusted under 35 U.S.C. 154(b) by 31 days.

(21) Appl. No.: 10/317,366

(22) Filed: Dec. 12, 2002

(65) Prior Publication Data

US 2003/0176583 A1 Sep. 18, 2003

Related U.S. Application Data

(60) Provisional application No. 60/340,526, filed on Dec. 21, 2001.

(51) Int. Cl.$^7$ ................................................. C08F 8/00
(52) U.S. Cl. ..................... 525/386; 525/329.5; 525/387
(58) Field of Search ................................. 525/386, 387

(56) References Cited

U.S. PATENT DOCUMENTS 5,321,094 A * 6/1994 McGee ........................ 525/387
6,136,499 A 10/2000 Goodall et al.
6,294,615 B1 9/2001 Rhodes et al.

FOREIGN PATENT DOCUMENTS

EP         0 789 278     8/1997
WO         97/33198      9/1997

* cited by examiner

Primary Examiner—Bernard Lipman
(74) Attorney, Agent, or Firm—Hudak, Shunk & Farine Co LPA

(57) ABSTRACT

The present invention relates to polycyclic polymers, methods for producing polycyclic polymers, and methods for their use as photoresists in the manufacture of integrated circuits. In one embodiment, the present invention relates to photoresist compositions formed from the polymerization of at least one halogenated polycyclic monomer or hydrohalogenated polycyclic monomer. In another embodiment, the present invention relates to photoresist compositions formed from the co-polymerization of at least one halogenated polycyclic monomer or hydrohalogenated polycyclic monomer with at least one non-halogenated polycyclic monomer. Additionally, the present invention relates to methods by which to post-treat such photoresist compositions in order to obtain one or more of: (1) a reduction in optical density of the polymer composition; and (2) a reduction in the amount of residual metal and/or monomer in the polymer composition. Also disclosed are catalyst systems for use in producing the photoresist compositions of the present invention which permit molecular weight control of the photoresist products.

20 Claims, 6 Drawing Sheets

Figure 2: Plot of OD vs. Mw for homopolymers of
α,α-bis(trifluoromethyl)bicyclo[2.2.1]hept-5-ene-2-ethanol
made using a palladium catalyst Figure 3: Plot of OD vs. Mw for homopolymers of
α,α-bis(trifluoromethyl)bicyclo[2.2.1]hept-5-ene-2-ethanol
made using a nickel catalyst Figure 4: Plot of OD vs. Mw for homopolymers of
α,α-bis(trifluoromethyl)bicyclo[2.2.1]hept-5-ene-2-ethanol made using a
palladium catalyst before and after treatment with acetic acid and hydrogen peroxide

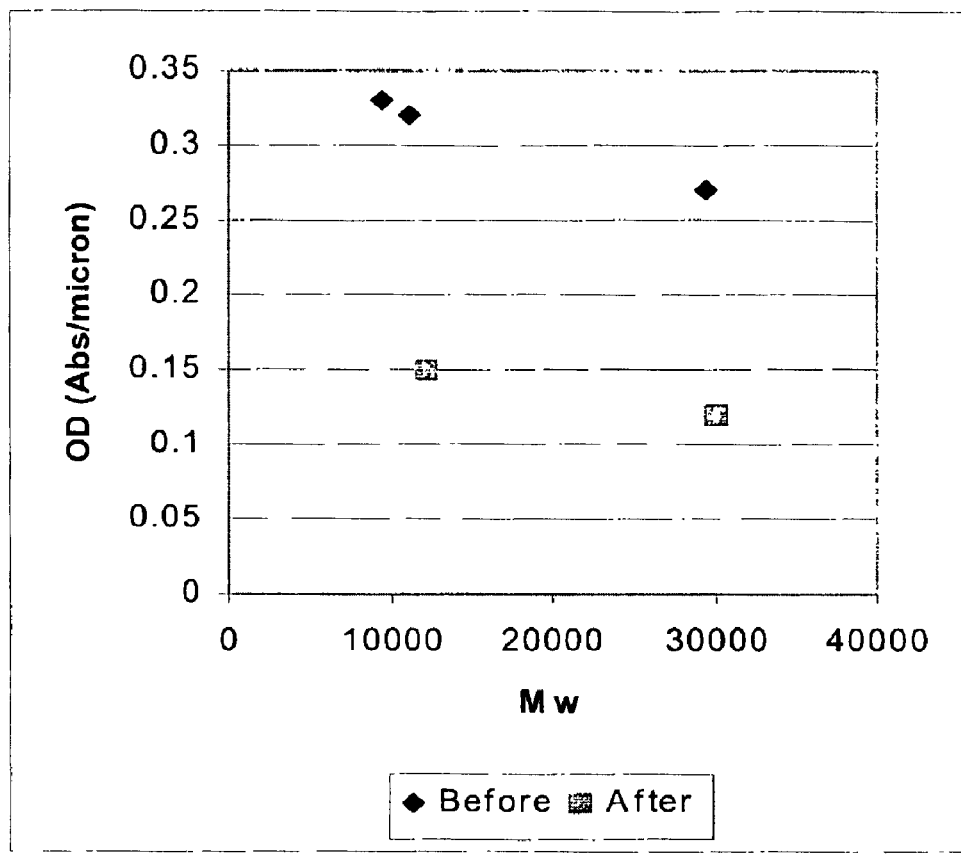
Figure 6: Plot of OD vs. Mw for copolymers of
α,α-bis(trifluoromethyl)bicyclo[2.2.1]hept-5-ene-2-ethanol and t-butylester
of 5-norbornene carboxylic acid made using palladium before and after
treatment with acetic acid and hydrogen peroxide

POLYMERIC COMPOSITIONS AND USES THEREFOR

This application claims the benefit of priority under 35 U.S.C. § 119 of U.S. Provisional Application Ser. No. 60/340,526 filed on Dec. 12, 2001.

FIELD OF THE INVENTION

The invention herein described relates generally to polycyclic polymers, methods for producing polycyclic polymers, and methods for their use in photoresist compositions used in the manufacture of electronic and microelectronic devices.

BACKGROUND

The fabrication of integrated circuits (IC's) is exemplary of the manufacture of an array of electronic and microelectronic devices. They are fabricated from the sequential formation of various conductive, semi conductive and non-conductive layers on an appropriate substrate (e.g., silicon wafer) that are selectively patterned to form circuits and interconnections to produce specific electrical functions. The patterning of IC's is carried out according to various lithography techniques known in the art. Photolithography employing ultraviolet (UV) light and increasingly deep UV light (e.g., 193 and 157 nm) or other radiation is a fundamental and important technology utilized in the production of IC devices. A photosensitive polymer film (photoresist) is applied over the wafer surface and dried. A photomask containing the desired patterning information is then placed between the radiation or light source and the photoresist film. The photoresist is irradiated through the overlying photomask by one of several types of imaging radiation including UV light, x-rays, electron or ion beam. Upon exposure to radiation, the photoresist undergoes a chemical change with concomitant changes in solubility. After irradiation and/or optional post exposure bake, the wafer is soaked in a solution that develops (i.e., selectively removes either the exposed or unexposed regions) the patterned images in the photosensitive polymer film. Depending on the type of polymer used, or the polarity of the developing solvent, either the exposed or nonexposed areas of film are removed in the developing process to expose the underlying substrate, after which the patterned exposed or unwanted substrate material is removed or changed by an etching process leaving the desired pattern in a functional layer of the wafer. Etching is accomplished by plasma etching, sputter etching, and reactive ion etching (RIE). The remaining photoresist material functions as a protective barrier against the etching process. Removal of the remaining photoresist material gives the patterned circuit.

In the manufacture of patterned IC devices, the processes of etching different layers on the wafer are among the most crucial steps involved. One method is to immerse the substrate and patterned resist in a chemical bath which attacks the exposed substrate surfaces while leaving the resist itself intact. This "wet" chemical process suffers from the difficulty of achieving well defined edges on the etched surfaces. This is due to chemical undercutting of the resist material and the formation of an isotropic image. In other words, conventional chemical processes do not provide the selectivity of direction (anisotropy) considered necessary to achieve optimum dimensional specifications consistent with current processing requirements. In addition, the wet processes suffer because of the undesirable environmental and safety ramifications.

Various "dry" processes have been developed to overcome the drawbacks of the wet chemical process. Such dry processes generally involve passing a gas through a chamber and ionizing the gas by applying a potential across two electrodes in the presence of the gas. The plasma containing the ionic species generated by the potential is used to etch a substrate placed in the chamber. The ionic species generated in the plasma are directed to the exposed substrate where they interact with the surface material forming volatile products that are removed from the surface. Typical examples of dry etching are plasma etching, sputter etching and reactive ion etching.

Reactive ion etching provides well defined vertical sidewall profiles in the substrate as well as substrate to substrate etching uniformity. Because of these advantages, the reactive ion etching technique has become the standard in IC manufacture.

Two types of photoresists are used in the industry, negative and positive photoresists. Negative resists, upon exposure to imaging radiation, polymerize, crosslink, or change solubility characteristics such that the exposed regions are insoluble to the developer. Unexposed areas remain soluble and are washed away. Positive resists function in the opposite way, becoming soluble in the developer solution after exposure to imaging radiation.

One type of positive photoresist material is based upon phenol-formaldehyde novolac polymers. A particular example is the commercially utilized Shipley AZ1350 material which comprises an m-cresol formaldehyde novolac polymer composition and a diazoketone (2-diazo-1-napthol-5-sulphonic acid ester). When exposed to imaging radiation, the diazoketone is converted to a carboxylic acid, which in turn converts the phenolic polymer to one that is readily soluble in weak aqueous base developing agent.

U.S. Pat. No. 4,491,628 to Ito et al. discloses positive and negative photoresist compositions with acid generating photo initiators and polymers with acid labile pendant groups. Because each acid generated causes deprotection of multiple acid labile groups this approach is known as chemical amplification which serves to increase the quantum yield of the overall photochemical process. The disclosed polymers include vinylic polymers such as polystyrenes, polyvinylbenzoates, and polyacrylates that are substituted with recurrent pendant groups that undergo acidolysis to produce products that differ in solubility than their precursors. The preferred acid labile pendant groups include t-butyl esters of carboxylic acids and t-butyl carbonates of phenols. The photoresist can be made positive or negative depending on the nature of the developing solution employed.

Trends in the electronics industry continually require IC's that are faster and consume less power. To meet this specification the IC must be made smaller. Conducting pathways (i.e., lines) must be made thinner and placed closer together. The significant reduction in the size of the transistors and the lines produced yields a concomitant increase in the efficiency of the IC, e.g., greater storage and processing of information on a computer chip. To achieve thinner line widths, higher photo imaging resolution is necessary. Higher resolutions are possible with shorter wave lengths of the exposure source employed to irradiate the photoresist material. However, the prior art photoresists such as the phenol-formaldehyde novolac polymers and the substituted styrenic polymers contain aromatic groups that inherently become increasingly absorptive as the wave length of light falls below about 300 nm, (ACS Symposium Series 537, *Poly-*

*mers for Microelectronics, Resists and Dielectrics,* 203rd National Meeting of the American Chemical Society, Apr. 5–10, 1992, p. 2–24; *Polymers for Electronic and Photonic Applications,* Edited by C. P. Wong, Academic Press, p. 67–118). Shorter wave length sources are typically less bright than traditional sources which necessitate a chemical amplification approach using photoacids. The opacity of these aromatic polymers to short wave length light is a drawback in that the photoacids below the polymer surface are not uniformly exposed to the light source and, consequently, the polymer is not developable. To overcome the transparency deficiencies of these polymers, the aromatic content of photoresist polymers must be reduced. If deep UV transparency is desired (i.e., for 248 nm and particularly 193 nm and/or 157 nm wave length exposure), the polymer should contain a minimum of aromatic character.

It is well known that low molecular weight polymers are preferred as photoresist matrix materials since they exhibit higher dissolution rates after exposure and post-exposure thermal treatment than higher molecular weight materials. High dissolution rates are desired in order to increase the throughput of wafer processing in a manufacturing environment. Unfortunately, it is also known that low molecular weight materials can also exhibit higher optical density than lower molecular materials if the end groups of the polymers absorb at the frequency of interest. See Barclay, et. al. *Macromolecules* 1998, 31, 1024 for a discussion of these issues for poly(4-hydroxystyrene), the preferred material for 248 nm photoresists.

The molecular weight of polycyclic polymers can be reduced by polymerizing desired polycycloolefin monomers in the presence of a single or multi-component transition metal catalyst and an α-olefinic chain transfer agent as taught in U.S. Pat. No. 5,468,819. In addition, α-olefinic chain transfer agents in combination with selected transition metal catalysts have found utility in controlling the molecular weight of polycyclic polymers polymerized from functional group containing polycycloolefin monomers. U.S. Pat. No. 6,136,499 discloses the use of such polymers in chemically amplified photoresist compositions. It is known from the foregoing disclosures that polymers prepared in accordance with these teachings contain olefinic unsaturation at a terminal end thereof. As discussed above, unsaturation increases the optical density of the polymer resulting in a less transparent polymer.

The optical density (OD), at the exposure wavelength, of a matrix resin for photoresist dictates its usefulness at that particular wavelength. A polymer having a high optical density at the exposure wavelength will limit the resolution capabilities of the resulting photoresist. For 193 and 157 nm resist systems, a low optical density is desirable not only to increase resolution but also decrease the exposure dose to image the wafer. Therefore, it is very desirable for 193 nm and 157 nm resist systems to have the lowest OD possible.

U.S. Pat. No. 5,372,912 concerns a photoresist composition containing an acrylate based copolymer, a phenolic type binder, and a photosensitive acid generator. The acrylate based copolymer is polymerized from acrylic acid, alkyl acrylate or methacrylate, and a monomer having an acid labile pendant group. While this composition is sufficiently transparent to UV radiation at a wave length of about 240 nm, the use of aromatic type binders limits the use of shorter wave length radiation sources. As is common in the polymer art, the enhancement of one property is usually accomplished at the expense of another. When employing acrylate based polymers, the gain in transparency to shorter wave length UV is achieved at the expense of sacrificing the resist's resistance to the reactive ion etch process.

In many instances, the improvement in transparency to short wave length imaging radiation results in the erosion of the resist material during the subsequent dry etching process. It follows that lower etch rate resist materials can be employed in thinner layers over the substrate to be etched. Thinner layers of resist material allow for higher resolution which, ultimately, allows for narrower conductive lines and smaller transistors.

J. V. Crivello et al. (*Chemically Amplified Electron-Beam Photoresists,* Chem. Mater., 1996, 8, 376–381) describe a polymer blend comprising 20 weight percent of a free radically polymerized homopolymer of a norbornene monomer bearing acid labile groups and 80 weight percent a homopolymer of 4-hydroxy-α-methylstyrene containing acid labile groups for use in electron-beam photoresists. As discussed supra, the increased absorbity (especially in high concentrations) of aromatic groups renders these compositions opaque and unusable for short wave length imaging radiation below 200 nm. The disclosed compositions are suitable only for electron-beam photoresists and can not be utilized for deep UV imaging (particularly not for 193 nm or 157 nm resists).

Crivello et al. investigated blend compositions because they observed the oxygen plasma etch rate to be unacceptably high for free radically polymerized homopolymers of norbornene monomers bearing acid labile groups.

Accordingly, there is a need for a photoresist composition which is compatible with the general chemical amplification scheme and provides transparency to short wave length imaging radiation while being sufficiently resistant to a reactive ion etching processing environment. Additionally, there is a need for methods by which to make such photoresist compositions and methods by which to control with a greater degree of certainty their molecular weights.

SUMMARY

Embodiments in accordance with the present invention relate to photoresist compositions from the homo-polymerization of one monomer according to Formula I; the co-polymerization of at least two different monomers according to Formula I; and the co-polymerization of at least one monomer according to Formula I with at least one monomer according to Formula II:

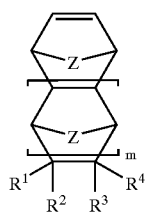

I

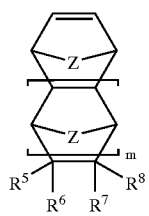

II wherein $R^1$ to $R^8$, Z and m are as defined below;

In other such embodiments, the present invention relates to a method for reducing the optical density of a polymer containing olefinic end groups via treatment with a post-functionalization reagent (e.g., post-treatment with a peracid, a hydosilation agent, hydrogenation agent, hydroformylation agent).

In another embodiment, the present invention relates to a method for reducing the optical density of any polycyclic polymer containing an olefinic end-group(s) which may be present in a polymer product via the post-functionalization of olefinic end groups by a post-functionalization agent, for example, an epoxidation, hydrogenation, hydroformylation, hydrosilation and/or cyclopropanation agent.

In another embodiment, the present invention relates to a method of removing residual monomer and/or catalyst via a suitable post treatment agent and mechanism from one or more polycyclic polymers.

The present invention is advantageous in that it provides polymer compositions which are useful in photoresist compositions in 193 nm and 157 nm applications. Such compositions have better performance qualities than currently available photoresist compositions. For example, a lower OD at the exposure wavelength, reduced swelling in an aqueous base developer, and a $P_{ka}$ similar to that of poly(para-hydroxystyrene).

Additionally, one embodiment of the present invention is advantageous in that it provides methods for the simultaneous control of molecular weight, reduction of optical density, and the reduction of residual monomer and catalyst metal from polymer compositions.

The foregoing and other features of the invention are hereinafter fully described and particularly pointed out in the following description and the annexed drawings setting forth in detail one or more illustrative embodiments of the invention, such being indicative, however, of but one or a few of the various ways in which the principles of the invention may be employed.

DESCRIPTION OF THE DRAWINGS

FIG. 6 is a plot of optical density (OD) versus Mw for copolymers of α,α, -bis(trifluoromethyl)bicyclo[2.2.1]hept-5-ene-2-ethanol and t-butylester of 5-norbornene carboxylic acid made using a palladium catalyst both before and after treatment with acetic acid and hydrogen peroxide.

DETAILED DESCRIPTION

Figure 1:
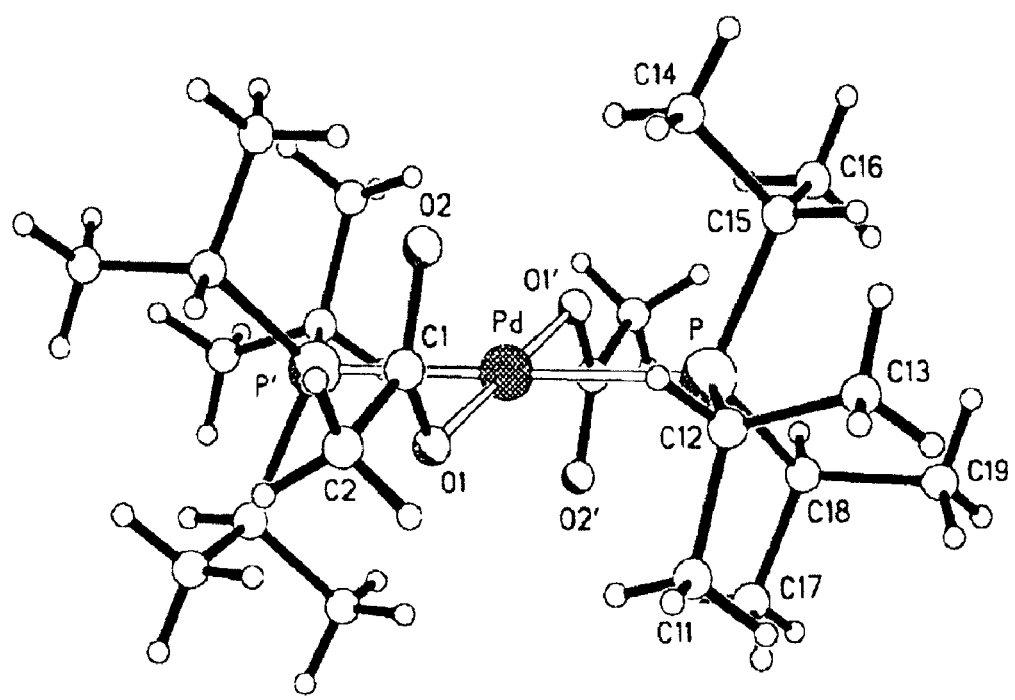
FIG. 1 is a ORTEP representation of Palladium bis(tri-i-propylphosphine) di(acetate)

It should be noted that in the following text and claims, range and ratio limits and/or range and time limits may be combined. Additionally, as used throughout the specification the term a halogenated polycyclic compound means a polycyclic compound which contains at least one halogen atom (e.g., chlorine, fluorine or bromine) in place of a hydrogen atom. The at least one halogen atom may be present in one or more of the rings present in the polycyclic compound. Alternatively, the at least one halogen atom may be present in a substituent or pendant group which is bonded to one or more of the rings in the polycyclic compound. In one embodiment, the halogenated substituent (e.g., halohydrocarbyl, perhalohydrocarbyl) may be one or more —(C$_6$F$_5$), one or more —CF$_3$ (trifluoromethyl) groups or one or more other fluorohydrocarbyl groups defined hereinbelow.

The present invention relates generally to polycyclic polymers, methods for producing polycyclic polymers, and methods for their use as photoresists in the manufacture of integrated circuits. In particular, the present invention relates to compositions formed from the polymerization of at least one non-halogenated polycyclic monomer or at least one halogenated polycyclic monomer or mixtures thereof. The at least one non-halogenated polycyclic monomer or halogenated polycyclic monomer may contain one or more acid labile groups along the polymer backbone. In another embodiment, the polycyclic polymer and the halogenated polycyclic polymer contains an olefinic end group, which end group is subsequently post-treated to remove the unsaturation. By non-halogenated polycyclic polymer is meant that the polymer is devoid of repeating units that contain halogen atoms. By halogenated polycyclic polymer is meant that at least a portion of the repeating units that are contained in the polymer backbone contain halogen atoms.

In yet another embodiment, the present invention relates to polymers suitable for use in photoresist compositions formed from the polymerization of at least one non-halogenated polycyclic monomer, at least one halogenated polycyclic monomer or mixtures thereof. In either instance, one or both of these monomers may contain one or more pendant acid labile groups.

Furthermore, the present invention relates to methods of controlling the molecular weight, residual metal content, residual monomer content and optical density of polycyclic polymers and polycyclic polymers suitable for use in photoresist compositions.

The polymers of the present invention comprise polycyclic repeating units. In one embodiment, the polycyclic polymer can be substituted with acid labile groups. The instant polymers are prepared by polymerizing the polycyclic monomers of this invention.

By the term "polycyclic" (norbornene-type or norbornene-functional) is meant that the monomer contains at least one norbornene moiety as shown below:

The simplest polycyclic monomer of the invention is the bicyclic monomer, bicyclo[2.2.1]hept-2-ene, commonly referred to as norbornene. As noted above, in one instance the present invention relates to polycyclic polymers formed from the polymerization of one or more polycyclic fluorinated monomers according to Formula I below. The one or more monomers according to Formula I can optionally (and independently of one another) contain an acid labile functionality (group). In another embodiment, one or more polycyclic fluorinated monomers according to Formula I below are combined with one or more monomers according to Formula II. In one embodiment, the polymerization reactions of the present invention are conducted in the presence of a Group 8, 9, or 10 (New Version Notation System) transition metal catalyst system.

Monomers:

The polycyclic monomers useful in the practice of the present invention are selected from a monomer represented by the Formula I below:

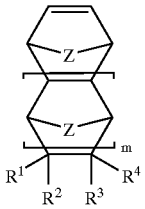

I wherein $R^1$ to $R^4$ independently represent hydrogen, linear or branched ($C_1$ to $C_{30}$) alkyl, linear and branched ($C_1$ to $C_{24}$) halohydrocarbyl), linear or branched ($C_2$ to $C_{30}$) olefin; —$(CH_2)_n$—C(O)OR*, —$(CH_2)_n$—C(O)OR, —$(CH_2)_n$—OR, —$(CH_2)_n$—OC(O)R, —$(CH_2)_n$—C(O)R, —$(CH_2)_n$—OC(O)OR, —$(CH_2)_n$—C(R)$_2$—CH(R)(C(O)OR), —$(CH_2)_n$—(CR$_2$)$_n$—CH(R)(C(O)OR), —$(CH_2)_n$—C(OR*)—(CF$_3$)$_2$, —(CR'$_2$)$_n$—O—R— and —$(CH_2)_n$—C(R)$_2$—CH(C(O)OR)$_2$, where R represents hydrogen, linear and branched ($C_1$ to $C_{10}$) alkyl, and —$(CH_2)_s$—OH; R' represents hydrogen or a halogen (i.e., fluorine, chlorine, bromine, and/or iodine); n is an integer from 0 to 10; m is an integer from 0 to 5; s is an integer from 1 to 10, and Z represents —$(CH_2)_p$—, oxygen, sulfur, or —NH— and p is equal to 1 or 2.

In one embodiment of the invention, at least one of $R^1$ to $R^4$ is either a halohydrocarbyl and/or a perhalocarbyl group. In one embodiment, n is 0. R* represents acid labile moieties (i.e., blocking or protecting groups) that are cleavable by photoacid initiators; and R*** represents —$CH_2$OR, —C(O)OR or —C(O)R. Any of the known acid labile groups can be employed in the present invention. The R* moiety can represent tertiary ($C_4$ to $C_{20}$) alkyl and cycloalkyl groups, tri($C_1$ to $C_6$) alkylsilyl groups and oxoalkyl groups of 4 to 20 carbon atoms. Exemplary tertiary alkyl groups include but are not limited to tert-butyl, tert-amyl and 1,1-diethylpropyl. Exemplary tertiary cycloalkyl groups include but are not limited to 1-methylcyclopentyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl. Exemplary trialkylsilyl groups included but are not limited to trimethylsilyl, triethylsilyl and dimethyl-tert-butylsilyl. Examples of oxoalkyl groups include 3-oxocyclohexyl, 4-methyl-2-oxooxan-4-yl, and 5- methyl-2-oxooxolan-5-yl. Other acid labile groups include isobornyl, tetrahydrofuranyl, tetrahydropyranoyl, 3-oxocyclohexanonyl, mevalonic lactonyl, dicyclopropylmethyl (Dcpm), and dimethylcyclopropylmethyl (Dmcp) groups. R** independently represents R or R*, as defined above. The Dcpm and Dmcp groups are respectively represented by the following structures:

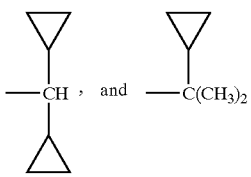

As used here and throughout the specification, the term halohydrocarbyl means that at least one hydrogen atom on the hydrocarbyl group, e.g., alkyl, alkenyl, alkynyl, cycloalkyl, aryl, and aralkyl groups, is replaced with a halogen atom selected from chlorine, bromine, iodine, fluorine and combinations thereof (e.g., haloalkyl, haloalkenyl, haloalkynyl, halocycloalkyl, haloaryl, and haloaralkyl). The halohydrocarbyl groups can contain 1 to 24 carbon atoms. The term fluorohydrocarbyl means that at least one hydrogen atom on the hydrocarbyl group is replaced by fluorine. The degree of halogenation can range from at least one hydrogen atom being replaced by a halogen atom (e.g., a monofluoromethyl group) to full halogenation (perhalogenation) wherein all hydrogen atoms on the hydrocarbyl group have been replaced by a halogen atom (e.g., perhalocarbyl such as trifluoromethyl (perfluoromethyl)). The fluorinated hydrocarbyl and perfluorocarbyl groups contain, in one embodiment, 1 to 24 carbon atoms. In another embodiment, the fluorinated hydrocarbyl and perfluorocarbyl groups contain 1 to 12 carbon atoms. In yet another embodiment, fluorinated hydrocarbyl and perfluorocarbyl groups contain 6 carbon atoms and can be linear or branched, cyclic, or aromatic. The fluorinated hydrocarbyl and perfluorocarbyl groups include but are not limited to fluorinated and perfluorinated linear and branched $C_1$–$C_{24}$ alkyl, fluorinated and perfluorinated $C_3$–$C_{24}$ cycloalkyl, fluorinated and perfluorinated $C_2$–$C_{24}$ alkenyl, fluorinated and perfluorinated $C_3$–$C_{24}$ cycloalkenyl, fluorinated and perfluorinated $C_6$–$C_{24}$ aryl, and fluorinated and perfluorinated $C_7$–$C_{24}$ aralkyl. The fluorinated and perfluorocarbyl ether substituents are represented by the formulae —$(CH_2)_q$OR''', or —$(CF_2)_q$OR''' respectively, wherein R''' is a fluorinated hydrocarbyl or perfluorocarbyl group as defined above, q is and integer from 0 to 5.

In one embodiment, the perhalohydrocarbyl groups include perhalogenated phenyl and alkyl groups. The halogenated alkyl groups useful in the invention are partially or fully halogenated and are linear or branched, and have the formula $C_rX''_{2r+1}$ wherein X'' is independently a halogen selected fluorine, chlorine, bromine and/or iodine, and r is selected from an integer of 1 to 20.

In one embodiment, the perfluorinated substituents include perfluorophenyl, perfluoromethyl, perfluoroethyl, perfluoropropyl, perfluorobutyl, and perfluorohexyl. In addition to the halogen substituents, the cycloalkyl, aryl, and aralkyl groups of the invention can be further substituted with linear and branched $C_1$–$C_5$ alkyl and haloalkyl groups, aryl groups and cycloalkyl groups.

In one embodiment, m is 0 or 1 in Formula I. In another embodiment, m is 0 in Formula I. When m is 0 the structures are represented by Formula Ia below:

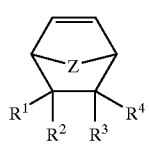

Ia wherein $R^1$ to $R^4$ and Z are defined as noted above. It should be apparent to those skilled in the art that any photoacid cleavable moiety is suitable in the practice of the invention so long as the polymerization reaction is not substantially inhibited by same.

In one embodiment, the acid labile groups are the organic ester groups which undergo a cleavage reaction in the presence of an acid. In another embodiment, the acid labile groups include ester groups and carbonate groups. In yet another embodiment, the acid labile groups are t-butyl esters of carboxylic acids.

In another embodiment, $R^1$ to $R^3$ are hydrogen, $R^4$ is —$(CH_2)_n$—$C(OR^{***})$—$(CF_3)_2$, m is 0, n is an integer from 0 to 10, and Z is —CH—. When this is the case, the structures of Formula I are represented below in Formula Ib below:

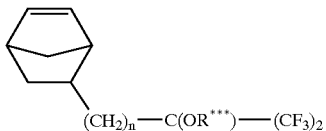

Ib wherein $R^{***}$ represents —$CH_2OR$, —$C(O)OR$ or —$C(O)R$ wherein R is defined as above.

In another embodiment, $R^1$ and $R^2$ are hydrogen, $R^3$ and $R^4$ are $C_rX''_{2r+1}$ (wherein X'' is independently a halogen selected fluorine, chlorine, bromine and/or iodine and r is selected from an integer of 1 to 20) and Z is —CH—. When this is the case, the structures of Formula I are represented below in Formula Ic below:

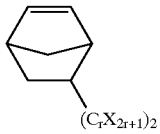

Ic

In one embodiment, a monomer according to one of Formulae I, Ia, Ib and Ic is polymerized using a catalyst system, as explained below, containing a Group 8, 9, or metal ion source to yield a homopolymer. In another embodiment, two or more different monomers according to Formulae I, Ia, Ib and Ic can be polymerized to form a co-polymer. Again, this polymerization reaction is conducted using a catalyst system containing a Group 8, 9, or 10 transition metal ion source, as is discussed below. In another embodiment, at least one monomer according to Formulae I, Ia, Ib and Ic can be co-polymerized with at least one monomer according to Formula II below:

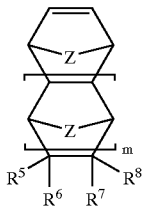

II wherein $R^5$ to $R^8$ independently represent hydrogen, linear or branched ($C_1$ to $C_{30}$) alkyl, linear or branched ($C_2$ to $C_{30}$) olefin; —$(CH_2)_n$—$C(O)OR^*$, —$(CH_2)_n$—$C(O)OR$, —$(CH_2)_n$—$OR$, —$(CH_2)_n$—$OC(O)R$, —$(CH_2)n$-$C(O)R$, —$(CH_2)_n$—$OC(O)OR$, —$(CH_2)_n$—$C(R)_2$—$CH(R)(C(O)OR^{})$, —$(CH_2)_n$—$(CR_2)_n$—$CH(R)(C(O)OR^{})$, —$(CR'_2)_n$—$O$—$R$— and —$(CH_2)_n$—$C(R)_2$—$CH(C(O)OR^{**})_2$; where R represents hydrogen, linear and branched ($C_1$ to $C_{10}$) alky, and —$(CH_2)_s$—$OH$; R' represents hydrogen or a halogen (i.e., fluorine, chlorine, bromine, and/or iodine); n is an integer from 0 to 10; m is an integer from 0 to 5, s is an integer from 1 to 10; and Z represents —$(CH_2)_p$—, oxygen, sulfur, or —NH— and p is equal to 1 or 2.

In one embodiment, n is 0. $R^*$ represents any of the known acid labile moieties as defined above. In another embodiment, at least one of $R^5$ to $R^8$ contains a halohydrocarbyl or perhalocarbyl group as defined above. In yet another embodiment, at least one of $R^5$ to $R^8$ is a halogenated acid labile group. The degree of halogenation can range from at least one hydrogen atom being replaced by a halogen atom to full halogenation (perhalogenation) wherein all hydrogen atoms on the hydrocarbyl group have been replaced by a halogen atom.

The monomers according to any one of Formulae I, Ia, Ib, Ic and II can be produced by a variety of methods. Such methods as well as catalyst systems for the polymerization of the above mentioned monomers are discussed in detail in U.S. Pat. No. 6,136,499 and U.S. Pat. No. 6,232,417, the disclosures of which are both hereby incorporated by reference in their entirety.

The polymers produced in accordance with the present invention comprise addition polymerized polycyclic repeating units linked via 2,3-enchainment. The polymers comprise at least one repeating unit selected from the structures represented below:

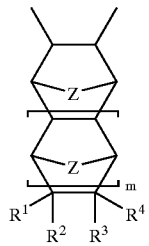

I'

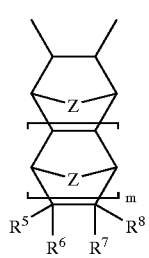

II' wherein $R^1$ to $R^8$ and m are as previously defined.

Catalyst Systems for Polymerization:

The polymers of this invention are obtained by polymerization of reaction mixtures comprising: (1) one monomer according to one of Formulae I, Ia, Ib and/or Ic; (2) two or more different monomers according to Formulae I, Ia, Ib and/or Ic; and (3) at least one monomer according to Formulae I, Ia, Ib and/or Ic and at least one monomer according to Formula II. The desired reaction mixture is combined with a solvent, a catalyst system containing a Group 8, 9, or 10 transition metal ion source, and an optional chain transfer agent. The catalyst system can be a preformed single component Group 8, 9, or 10 transition metal based catalyst or a multicomponent Group 8, 9, or 10 transition metal catalyst.

Single Component Systems:

In one aspect of the invention a single component catalyst system useful in making polymers utilized in this invention is represented by the formula:

$$E_nNi(C_6F_5)_2$$

wherein n is 1 or 2 and E represents a neutral 2 electron donor ligand. In one embodiment, when n is 1, E is a π-arene ligand such as toluene, benzene, and mesitylene. In another embodiment, when n is 2, E is selected from diethylether, tetrahydrofuran (THF), ethylacetate and dioxane.

In one embodiment, the single component catalysts utilized in the present invention are bis(ethylacetate)bis (perfluorophenyl) nickel, (toluene)bis(perfluorophenyl) nickel, (mesitylene)bis(perfluorophenyl) nickel, (benzene) bis(perfluorophenyl) nickel, bis(tetrahydrofuran)bis (perfluorophenyl) nickel and bis(dioxane)bis (perfluorophenyl) nickel.

In the single component catalyst embodiment, the molar ratio of total monomer to catalyst (based on the metal) in the reaction medium can range from about 5:1 to about 100,000:1, or from about 50:1 to about 20,000:1, or from about 100:1 to about 10,000, or even from about 100:1 to about 2,000:1.

Additional Catalyst Systems:

In another aspect, catalyst systems useful for making the polymers are disclosed in WO 00/20472. One such catalyst system which can be utilized to polymerize the polycyclic monomers of the present invention is represented by the general formula shown below:

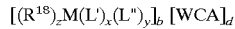
$[(R^{18})_z M(L')_x(L'')_y]_b [WCA]_d$       III wherein M represents a Group 10 transition metal; $R^{18}$ represents an anionic hydrocarbyl containing ligand; L' represents a Group 15 neutral electron donor ligand; L'' represents a labile neutral electron donor ligand; z is 0 or 1; x is 1 or 2; y is 0, 1, 2, or 3, and the sum of x, y, and z equals 4; and b and d are numbers representing the number of times the cation complex and weakly coordinating counteranion complex (WCA), respectively, are taken to balance the electronic charge on the overall catalyst complex. The monomer charge can be neat or in solution, and is contacted with a preformed catalyst of the foregoing formula. Alternatively, the catalyst can be formed in situ by admixing the catalyst forming components in the monomer charge.

The weakly coordinating counteranion complex is an anion which is only weakly coordinated to the cation complex. It is sufficiently labile to be displaced by a neutral Lewis base, solvent or monomer. More specifically, the WCA anion functions as a stabilizing anion to the cation complex and does not transfer to the cation complex to form a neutral product. The WCA anion is relatively inert in that it is non-oxidative, non-reducing, and non-nucleophilic.

An anionic hydrocarbyl ligand is any hydrocarbyl ligand which when removed from the metal center M in its closed shell electron configuration, has a negative charge.

A neutral electron donor is any ligand which when removed from the metal center M in its closed shell electron configuration, has a neutral charge.

A labile neutral electron donor ligand is any ligand which is not as strongly bound to metal center M, is easily displaced therefrom, and when removed from the metal center in its closed shell electron configuration has a neutral charge.

In the cation complex above, M represents a Group 10 transition metal selected from nickel, palladium, or platinum. In another embodiment, M represents nickel or palladium.

Representative anionic hydrocarbyl containing ligands defined under $R^{18}$ include linear and branched $C_1$–$C_{20}$ alkyl, $C_5$–$C_{10}$ cycloalkyl, linear and branched $C_2$–$C_{20}$ alkenyl, $C_6$–$C_{15}$ cycloalkenyl, allylic ligands or canonical forms thereof, $C_6$–$C_{30}$ aryl, $C_6$–$C_{30}$ heteroatom containing aryl, and $C_7$–$C_{30}$ aralkyl, each of the foregoing groups can be optionally substituted with hydrocarbyl and/or heteroatom substituents which, in one embodiment, are selected from linear or branched $C_1$–$C_5$ alkyl, linear or branched $C_1$–$C_5$ haloalkyl, linear or branched $C_2$–$C_5$ alkenyl and haloalkenyl, halogen, sulfur, oxygen, nitrogen phosphorus, and phenyl optionally substituted with linear or branched $C_1$–$C_5$ alkyl, linear or branched $C_1$–$C_5$ haloalkyl, and halogen. $R^{18}$ also represents anionic hydrocarbyl containing ligands of the formula $R^{19}C(O)O$, $R^{19}OC(O)CHC(O)R^{19}$, $R^{19}C(O)S$, $R^{19}C(S)O$, $R^{19}C(S)S$, $R^{19}O$, $R^{19}_2N$, wherein $R^{19}$ is the same as $R^{18}$ defined immediately above.

The foregoing cycloalkyl, and cycloalkenyl ligands can be monocyclic or multicyclic. The aryl ligands can be a single ring (e.g., phenyl) or a fused ring system (e.g., naphthyl). In addition, any of the cycloalkyl, cycloalkenyl and aryl groups can be taken together to form a fused ring system. Each of the monocyclic, multicyclic and aryl ring systems described above optionally can be monosubstituted or multisubstituted with a substituent independently selected from hydrogen, linear and branched $C_1$–$C_5$ alkyl, linear and branched $C_1$–$C_5$ haloalkyl, linear and branched $C_1$–$C_5$ alkoxy, halogen selected from chlorine, fluorine, iodine and bromine, $C_5$–$C_{10}$ cycloalkyl, $C_6$–$C_{15}$ cycloalkenyl, and $C_6$–$C_{30}$ aryl.

As is also disclosed in WO 00/20472, $R^{18}$ can represent a hydrocarbyl ligand containing a terminal group that coordinates to the Group 10 metal. The terminal coordination group containing hydrocarbyl ligand are represented by the formula —$C_{d'}H_{2d'}X$, wherein d' represents the number of carbon atoms in the hydrocarbyl backbone and is an integer from 3 to 10, and X represents an alkenyl or heteroatom containing moiety that coordinates to the Group 10 metal center. The ligand together with the Group 10 metal forms a metallacycle or heteroatom containing metallacycle.

Representative neutral electron donor ligands under L' include amines, pyridines organophosphorus containing compounds and arsines and stibines, of the formula:

$E(R^{20})_3$ wherein E is arsenic or antimony, and $R^{20}$ is independently selected from hydrogen, linear and branched $C_1$–$C_{10}$ alkyl, $C_3$–$C_{10}$ cycloalkyl, linear and branched $C_1$–$C_{10}$ alkoxy, allyl, linear and branched $C_2$–$C_{10}$ alkenyl, $C_6$–$C_{12}$ aryl, $C_6$–$C_{12}$ aryloxy, $C_6$–$C_{12}$ arylsufides (e.g., PhS), $C_7$–$C_{18}$ aralkyl, cyclic ethers and thioethers, tri(linear and branched $C_1$–$C_{10}$ alkyl)silyl, tri($C_6$–$C_{12}$ aryl)silyl, tri(linear and branched $C_1$–$C_{10}$ alkoxy)silyl, triaryloxysilyl, tri(linear and branched $C_1$–$C_{10}$ alkyl)siloxy, and tri($C_6$–$C_{12}$ aryl)siloxy, each of the foregoing substituents can be optionally substituted with linear or branched $C_1$–$C_5$ alkyl, linear or branched $C_1$–$C_5$ haloalkyl, $C_1$–$C_5$ alkoxy, halogen, and combinations thereof. Representative alkyl groups include but are not limited to methyl, ethyl, propyl, isopropyl, n-butyl, isobutyl, sec-butyl, tert-butyl, pentyl, neopentyl, hexyl, heptyl, octyl, nonyl, decyl, and dodecyl. Representative cycloalkyl groups include but are not limited to cyclopentyl and cyclohexyl. Representative alkoxy groups include but are not limited to methoxy, ethoxy, and isopropoxy. Representative cyclic ether and cyclic thioether groups include but are not limited to furyl and thienyl, respectively. Representative aryl groups include but are not limited to phenyl, o-tolyl, and naphthyl. Representative aralkyl groups include but are not limited to benzyl, and phenylethyl (i.e., —$CH_2CH_2PH$). Representative silyl groups include but are not limited to triphenylsilyl, trimethylsilyl, and triethylsilyl. As in the general definition above each of the foregoing groups can be optionally substituted with linear or branched $C_1$–$C_5$ alkyl, linear or branched $C_1$–$C_5$ haloalkyl, and halogen.

Representative pyridines include lutidine (including 2,3-; 2,4-; 2,5-; 2,6-; 3,4-; and 3,5-substituted), picoline (including 2-, 3-, or 4-substituted), 2,6-di-t-butylpyridine, and 2,4-di-t-butylpyridine.

Representative arsines include triphenylarsine, triethylarsine, and triethoxysilylarsine.

Representative stibines include triphenylstibine and trithiophenylstibine.

Suitable amine ligands can be selected from amines of the formula $N(R^{21})_3$, wherein $R^{21}$ independently represents hydrogen, linear and branched $C_1$–$C_{20}$ alkyl, linear and branched $C_1$–$C_{20}$ haloalkyl, substituted and unsubstituted $C_3$–$C_{20}$ cycloalkyl, substituted and unsubstituted $C_6$–$C_{18}$ aryl, and substituted and unsubstituted $C_7$–$C_{18}$ aralkyl. When substituted, the cycloalkyl, aryl and aralkyl groups can be monosubstituted or multisubstituted, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine. Representative amines include but are not limited to ethylamine, triethylamine, diisopropylamine, tributylamine, N,N-dimethylaniline, N,N-dimethyl-4-t-butylaniline, N,N-dimethyl-4-t-octylaniline, and N,N-dimethyl-4-hexadecylaniline.

The organophosphorus containing ligands include phosphines, phosphites, phosphonites, phosphinites and phosphorus containing compounds of the formula:

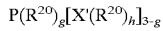

wherein X' is oxygen, nitrogen, or silicon, $R^{20}$ is as defined above and each $R^{20}$ substituent is independent of the other, g is 0, 1, 2, or 3, and h is 1, 2, or 3, with the proviso that when X' is a silicon atom, h is 3, when X' is an oxygen atom h is 1, and when X' is a nitrogen atom, h is 2. When g is 0 and X' is oxygen, any two or 3 of $R^{20}$ can be taken together with the oxygen atoms to which they are attached to form a cyclic moiety. When g is 3 any two of $R^{20}$ can be taken together with the phosphorus atom to which they are attached to represent a phosphacycle of the formula:

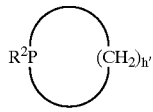

wherein $R^{20}$ is as previously defined and h' is an integer from 4 to 11.

The organophosphorus compounds can also include bidentate phosphine ligands of the formulae:

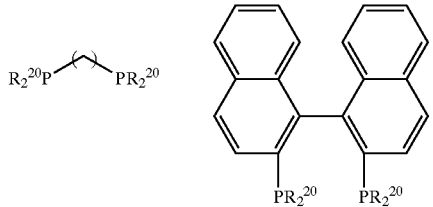

wherein $R^{20}$ is as previously defined and i is 0, 1, 2, or 3 are also contemplated herein.

Representative phosphine ligands include, but are not limited to trimethylphosphine, triethylphosphine, tricyclopropylphosphine, tricyclopentylphosphine, tri-n-propylphosphine, tri-isopropylphosphine, tri-n-butylphosphine, tri-sec-butylphosphine, tri-i-butylphosphine, tri-t-butylphosphine, tricyclopentylphosphine, triallylphosphine, tricyclohexylphosphine, triphenylphosphine, trinaphthylphosphine, tri-p-tolylphosphine, tri-o-tolylphosphine, tri-m-tolylphosphine, tribenzylphosphine, tri(p-trifluoromethylphenyl)phosphine, tris(trifluoromethyl) phosphine, tri(p-fluorophenyl)phosphine, tri(p-trifluoromethylphenyl)phosphine, allyldiphenylphosphine, benzyldiphenylphosphine, bis(2-furyl)phosphine, bis(4-methoxyphenyl)phenylphosphine, bis(4-methylphenyl) phosphine, bis(3,5-bis(trifluoromethyl)phenyl)phosphine, t-butylbis(trimethylsilyl)phosphine, t-butyldiphenylphosphine, cyclohexyldiphenylphosphine, diallylphenylphosphine, dibenzylphosphine, dibutylphenylphosphine, dibutylphosphine, di-t-butylphosphine, dicyclohexylphosphine, diethylphenylphosphine, di-i-butylphosphine, dimethylphenylphosphine, dimethyl(trimethylsilyl) phosphine, diphenylphosphine, diphenylpropylphosphine, diphenyl(p-tolyl)phosphine, diphenyl(trimethylsilyl) phosphine, diphenylvinylphosphine, divinylphenylphosphine, ethyldiphenylphosphine, (2-methoxyphenyl)methylphenylphosphine, tri-n-octylphosphine, tris(3,5-bis(trifluoromethyl)phenyl) phosphine, tris(3-chlorophenyl)phosphine, tris(4-chlorophenyl)phosphine, tris(2,6-dimethoxyphenyl) phosphine, tris(3-fluorophenyl)phosphine, tris(2-furyl) phosphine, tris(2-methoxyphenyl)phosphine, tris(3-methoxyphenyl)phosphine)phosphine, tris(4-methoxyphenyl)phosphine, tris(3-methoxypropyl) phosphine, tris(2-thienyl)phosphine, tris(2,4,6-trimethylphenyl)phosphine, tris(trimethylsilyl)phosphine, isopropyldiphenylphosphine, dicyclohexylphenylphosphine, (+)-neomenthyldiphenylphosphine, tribenzylphosphine, diphenyl(2-methoxyphenyl)phosphine, diphenyl (pentafluorophenyl)phosphine, bis(pentafluorophenyl) phenylphosphine, and tris(pentafluorophenyl)phosphine.

Exemplary bidentate phosphine ligands include, but are not limited to, (R)-(+)-2,2'-Bis(diphenylphosphino)-1,1'-binaphthyl; bis(dicyclohexylphosphino)methane; bis (dicyclohexylphosphino)ethane; bis(diphenylphosphino) methane; bis(diphenylphosphino)ethane.

The phosphine ligands can also be selected from phosphine compounds that are water soluble thereby imparting the resulting catalysts with solubility in aqueous media. Selected phosphines of this type include but are not limited to carboxylic substituted phosphines such as 4-(diphenylphosphine)benzoic acid, and 2-(diphenylphosphine)benzoic acid, sodium 2-(dicyclohexylphosphino)ethanesulfonate, 4,4'-(phenylphosphinidene)bis(benzene sulfonic acid) dipotassium salt, 3,3',3''-phosphinidynetris(benzene sulfonic acid) trisodium salt, 4-(dicyclohexylphosphino)-1,1-dimethylpiperidinium chloride, 4-(dicyclohexylphosphino)-1,1-dimethylpiperidinium iodide, quaternary amine-functionalized salts of phosphines such as 2-(dicyclohexylphosphino)-N,N,N-trimethylethanaminium chloride, 2,2'-(cyclohexylphosphinidene)bis[N,N,N-trimethylethanaminium dichloride, 2,2'-(cyclohexylphosphinidene)bis(N,N,N-trimethylethanaminium) diiodide, and 2-(dicyclohexylphosphino)-N,N,N-trimethylethanaminium iodide.

Examples of phosphite ligands include but are not limited to trimethylphosphite, diethylphenylphosphite, triethylphosphite, tris(2,4-di-t-butylphenyl)phosphite, tri-n-propylphosphite, triisopropylphosphite, tri-n-butylphosphite, tri-sec-butylphosphite, triisobutylphosphite, tri-t-butylphosphite, dicyclohexylphosphite, tricyclohexylphosphite, triphenylphosphite, tri-p-tolylphosphite, tris(p-trifluoromethylphenyl)phosphite, benzyldiethylphosphite, and tribenzylphosphite.

Examples of phosphinite ligands include but are not limited to methyl diphenylphosphinite, ethyl diphenylphosphinite, isopropyl diphenylphosphinite, and phenyl diphenylphosphinite.

Examples of phosphonite ligands include but are not limited to diphenyl phenylphosphonite, dimethyl phenylphosphonite, diethyl methylphosphonite, diisopropyl phenylphosphonite, and diethyl phenylphosphonite.

Representative labile neutral electron donor ligands (L") are reaction diluent, reaction monomers, DMF, DMSO, dienes including $C_4$ to $C_{10}$ aliphatic and $C_4$ to $C_{10}$ cycloaliphatic dienes representative dienes include butadiene, 1,6-hexadiene, and cyclooctadiene (COD), water, chlorinated alkanes, alcohols, ethers, ketones, nitriles, arenes, phosphine oxides, organic carbonates and esters.

Representative chlorinated alkanes include but are not limited to dichloromethane, 1,2-dichloroethane, and carbon tetrachloride.

Suitable alcohol ligands can be selected from alcohols of the formula $R^{22}OH$, wherein $R^{22}$ represents linear and branched $C_1$–$C_{20}$ alkyl, linear and branched $C_1$–$C_{20}$ haloalkyl, substituted and unsubstituted $C_3$–$C_{20}$ cycloalkyl, substituted and unsubstituted $C_6$–$C_{18}$ aryl, and substituted and unsubstituted $C_6$–$C_{18}$ aralkyl. When substituted, the cycloalkyl, aryl and aralkyl groups can be monosubstituted or multisubstituted, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine. Representative alcohols include but are not limited to methanol, ethanol, n-propanol, isopropanol, butanol, hexanol, t-butanol, neopentanol, phenol, 2,6-di-i-propylphenol, 4-t-octylphenol, 5-norbornene-2-methanol, and dodecanol.

Suitable ether ligands and thioether ligands can be selected from ethers and thioethers of the formulae ($R^{23}$—O—$R^{23}$) and ($R^{23}$—S—$R^{23}$), respectively, wherein $R^{23}$ independently represents linear and branched $C_1$–$C_{10}$ alkyl groups, linear and branched $C_1$–$C_{20}$ haloalkyl, substituted and unsubstituted $C_3$–$C_{20}$ cycloalkyl, linear and branched $C_1$–$C_{20}$ alkoxy substituted and unsubstituted $C_6$–$C_{18}$ aryl, and substituted and unsubstituted $C_6$–$C_{18}$ aralkyl. When substituted, the cycloalkyl, aryl and aralkyl groups can be monosubstituted or multisubstituted, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine, taken together along with the oxygen or sulfur atom to which they are attached to form a cyclic ether or cyclic thioether. Representative ethers include but are not limited to dimethyl ether, dibutyl ether, methyl-t-butyl ether, di-i-propyl ether, diethyl ether, dioctyl ether, 1,4-dimethoxyethane, THF, 1,4-dioxane and tetrahydrothiophene.

Suitable ketone ligands are represented by ketones of the formula $R^{24}C(O)R^{24}$ wherein $R^{24}$ independently represents linear and branched $C_1$–$C_{20}$ alkyl, linear and branched $C_1$–$C_{20}$ haloalkyl, substituted and unsubstituted $C_3$–$C_{20}$ cycloalkyl, substituted and unsubstituted $C_6$–$C_{18}$ aryl, and substituted and unsubstituted $C_6$–$C_{18}$ aralkyl. When substituted, the cycloalkyl, aryl and aralkyl groups can be monosubstituted or multisubstituted, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine. Representative ketones include but are not limited to acetone, methyl ethyl ketone, cyclohexanone, and benzophenone.

The nitrile ligands can be represented by the formula $R^{25}CN$, wherein $R^{25}$ represents hydrogen, linear and branched $C_1$–$C_{20}$ alkyl, linear and branched $C_1$–$C_{20}$ haloalkyl, substituted and unsubstituted $C_3$–$C_{20}$ cycloalkyl, substituted and unsubstituted $C_6$–$C_{18}$ aryl, and substituted and unsubstituted $C_6$–$C_{18}$ aralkyl. When substituted, the cycloalkyl, aryl and aralkyl groups can be monosubstituted or multisubstituted, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine. Representative nitriles include but are not limited to acetonitrile, propionitrile, benzonitrile, benzyl cyanide, and 5-norbornene-2-carbonitrile.

The arene ligands can be selected from substituted and unsubstituted $C_6$–$C_{12}$ arenes containing monosubstitution or multisubstitution, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine. Representative arenes include but are not limited to toluene, benzene, o-, m-, and p-xylenes, mesitylene, fluorobenzene, o-difluorobenzene, p-difluorobenzene, chlorobenzene, pentafluorobenzene, o-dichlorobenzene, and hexafluorobenzene.

Suitable trialkyl and triaryl phosphine oxide ligands can be represented by phosphine oxides of the formula $P(O)(R^{26})_3$, wherein $R^{26}$ independently represents linear and branched $C_1$–$C_{20}$ alkyl, linear and branched $C_1$–$C_{20}$ haloalkyl, substituted and unsubstituted $C_3$–$C_{20}$ cycloalkyl, linear and branched $C_1$–$C_{20}$ alkoxy, linear and branched $C_1$–$C_{20}$ haloalkoxy, substituted and unsubstituted $C_6$–$C_{18}$ aryl, and substituted and unsubstituted $C_6$–$C_{18}$ aralkyl. When substituted, the cycloalkyl, aryl and aralkyl groups can be monosubstituted or multisubstituted, wherein the substituents are independently selected from hydrogen, linear and branched $C_1$–$C_{12}$ alkyl, linear and branched $C_1$–$C_5$ haloalkyl, linear and branched $C_1$–$C_5$ alkoxy, $C_6$–$C_{12}$ aryl, and halogen selected from chlorine, bromine, and fluorine. Representative phosphine oxides include but are not limited to triphenylphosphine oxide, tributylphosphine oxide, trioctylphosphine oxide, tributylphosphate, and tris(2-ethylhexyl)phosphate.

Representative carbonates include but are not limited to ethylene carbonate and propylene carbonate.

Representative esters include but are not limited to ethyl acetate and i-amyl acetate.

WCA Description

The weakly coordinating counteranion complex, [WCA], of Formula III can be selected from borates and aluminates, boratobenzene anions, carborane and halocarborane anions.

The borate and aluminate weakly coordinating counteranions are represented by Formulae IV and V below:

$$[M'(R^{27})(R^{28})(R^{29})(R^{30})] \quad\quad IV$$

$$[M'(OR^{31})(OR^{32})(OR^{33})(OR^{34})] \quad\quad V$$

wherein in Formula IV M' is boron or aluminum and $R^{27}$, $R^{28}$, $R^{29}$, and $R^{30}$ independently represent fluorine, linear and branched $C_1$–$C_{10}$ alkyl, linear and branched $C_1$–$C_{10}$ alkoxy, linear and branched $C_3$–$C_5$ haloalkenyl, linear and branched $C_3$–$C_{12}$ trialkylsiloxy, $C_{18}$–$C_{36}$ triarylsiloxy, substituted and unsubstituted $C_6$–$C_{30}$ aryl, and substituted and unsubstituted $C_6$–$C_{30}$ aryloxy groups, wherein $R^{27}$ to $R^{30}$ can not all simultaneously represent alkoxy or aryloxy groups. When substituted the aryl groups can be monosubstituted or multisubstituted, wherein the substituents are independently selected from linear and branched $C_1$–$C_5$ alkyl, linear and branched $C_1$–$C_5$ haloalkyl, linear and branched $C_1$–$C_5$ alkoxy, linear and branched $C_1$–$C_5$ haloalkoxy, linear and branched $C_1$–$C_{12}$ trialkylsilyl, $C_6$–$C_{18}$ triarylsilyl, and halogen selected from chlorine, bromine, and fluorine. In another embodiment, the halogen is fluorine.

Representative borate anions under Formula IV include but are not limited to tetrakis(pentafluorophenyl)borate, tetrakis(3,5-bis(trifluoromethyl)phenyl)borate, tetrakis(2-fluorophenyl)borate, tetrakis(3-fluorophenyl)borate, tetrakis(4-fluorophenyl)borate, tetrakis(3,5-difluorophenyl)borate, tetrakis(2,3,4,5-tetrafluorophenyl)borate, tetrakis(3,4,5,6-tetrafluorophenyl)borate, tetrakis(3,4,5-trifluorophenyl)borate, methyltris(perfluorophenyl)borate, ethyltris(perfluorophenyl)borate, phenyltris(perfluorophenyl)borate, tetrakis(1,2,2-trifluoroethylenyl)borate, tetrakis(4-tri-i-propylsilyltetrafluorophenyl)borate, tetrakis(4-dimethyl-tert-butylsilyltetrafluorophenyl)borate, (triphenylsiloxy)tris(pentafluorophenyl)borate, (octyloxy)tris(pentafluorophenyl)borate, tetrakis[3,5-bis[1-methoxy-2,2,2-trifluoro-1-(trifluoromethyl)ethyl]phenyl]borate, tetrakis[3-[1-methoxy-2,2,2-trifluoro-1-(trifluoromethyl)ethyl]-5-(trifluoromethyl)phenyl]borate, and tetrakis[3-[2,2,2-trifluoro-1-(2,2,2-trifluoroethoxy)-1-(trifluoromethyl)ethyl]-5-(trifluoromethyl)phenyl]borate.

Representative aluminate anions under Formula IV include but are not limited to tetrakis(pentafluorophenyl) aluminate, tris(perfluorobiphenyl)fluoroaluminate, (octyloxy)tris(pentafluorophenyl)aluminate, tetrakis(3,5-bis(trifluoromethyl)phenyl)aluminate, and methyltris(pentafluorophenyl)aluminate.

In Formula V, M' is boron or aluminum, $R^{31}$, $R^{32}$, $R^{33}$, and $R^{34}$ independently represent linear and branched $C_1$–$C_{10}$ alkyl, linear and branched $C_1$–$C_{10}$ haloalkyl, $C_2$–$C_{10}$ haloalkenyl, substituted and unsubstituted $C_6$–$C_{30}$ aryl, and substituted and unsubstituted $C_7$–$C_{30}$ aralkyl groups, subject to the proviso that at least three of $R^{31}$ to $R^{34}$ must contain a halogen containing substituent. When substituted, the aryl and aralkyl groups can be monosubstituted or multisubstituted, wherein the substituents are independently selected from linear and branched $C_1$–$C_5$ alkyl, linear and branched $C_1$–$C_5$ haloalkyl, linear and branched $C_1$–$C_5$ alkoxy, linear and branched $C_1$–$C_{10}$ haloalkoxy, and halogen selected from chlorine, bromine, and fluorine. In another embodiment, the halogen is fluorine. The groups $OR^{31}$ and $OR^{32}$ can be taken together to form a chelating substituent represented by —O—$R^{35}$—O—, wherein the oxygen atoms are bonded to M' and $R^{35}$ is a divalent group selected from substituted and unsubstituted $C_6$–$C_{30}$ aryl and substituted and unsubstituted $C_7$–$C_{30}$ aralkyl. In one embodiment, the oxygen atoms are bonded, either directly or through an alkyl group, to the aromatic ring in the ortho or meta position. When substituted, the aryl and aralkyl groups can be monosubstituted or multisubstituted, wherein the substituents are independently selected from linear and branched $C_1$–$C_5$ alkyl, linear and branched $C_1$–$C_5$ haloalkyl, linear and branched $C_1$–$C_5$ alkoxy, linear and branched $C_1$–$C_{10}$ haloalkoxy, and halogen selected from chlorine, bromine, and fluorine. In another embodiment, the halogen is fluorine. Representative structures of divalent $R^{35}$ groups are disclosed in WO 00/20472, which is hereby incorporated by reference.

Representative borate and aluminate anions under Formula IV include but are not limited to $[B(OC(CF_3)_3)_4]^-$, $[B(OC(CF_3)_2(CH_3))_4]^-$, $[B(OC(CF_3)_2H)_4]^-$, $[B(OC(CF_3)(CH_3)H)_4]^-$, $[Al(OC(CF_3)_2Ph)_4]^-$, $[B(OCH_2(CF_3)_2)_4]^-$, $[Al(OC(CF_3)_2C_6H_4CH_3)_4]^-$, $[Al(OC(CF_3)_3)_4]^-$, $[Al(OC(CF_3)(CH_3)H)_4]^-$, $[Al(OC(CF_3)_2H)_4]^-$, $[Al(OC(CF_3)_2C_6H_4\text{-}4\text{-}i\text{-}Pr)_4]^-$, $[Al(OC(CF_3)_2C_6H_4\text{-}4\text{-}t\text{-}butyl)_4]^-$, $[Al(OC(CF_3)_2C_6H_4\text{-}4\text{-}SiMe_3)_4]^-$, $[Al(OC(CF_3)_2C_6H_4\text{-}4\text{-}Si\text{-}i\text{-}Pr_3)_4]^-$, $[Al(OC(CF_3)_2C_6H_2\text{-}2,6\text{-}(CF_3)_2\text{-}4\text{-}Si\text{-}i\text{-}Pr_3)_4]^-$, $[Al(OC(CF_3)_2C_6H_3\text{-}3,5\text{-}(CF_3)_2)_4]^-$, $[Al(OC(CF_3)_2C_6H_2\text{-}2,4,6\text{-}(CF_3)_3)_4]^-$, and $[Al(OC(CF_3)_2C_6F_5)_4]^-$.

The boratobenzene anions useful as the weakly coordinating counteranion can be represented by Formula VI below:

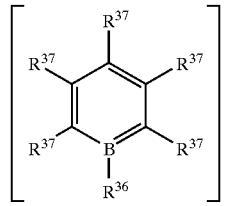

VI wherein $R^{36}$ is selected from fluorine, fluorinated hydrocarbyl, perfluorocarbyl, and fluorinated and perfluorinated ethers. In yet another embodiment, fluorinated hydrocarbyl and perfluorocarbyl groups contain 6 carbon atoms and can be linear or branched, cyclic, or aromatic. The fluorinated hydrocarbyl and perfluorocarbyl groups include but are not limited to fluorinated and perfluorinated linear and branched $C_1$–$C_{24}$ alkyl, fluorinated and perfluorinated $C_3$–$C_{24}$ cycloalkyl, fluorinated and perfluorinated $C_2$–$C_{24}$ alkenyl, fluorinated and perfluorinated $C_3$–$C_{24}$ cycloalkenyl, fluorinated and perfluorinated $C_6$–$C_{24}$ aryl, and fluorinated and perfluorinated $C_7$–$C_{24}$ aralkyl. The fluorinated and perfluorocarbyl ether substituents are represented by the formulae —$(CH_2)_mOR^{38}$, or —$(CF_2)_mOR^{38}$ respectively, wherein $R^{38}$ is a fluorinated or perfluorocarbyl group as defined above, m is and integer of 0 to 5. It is to be noted that when m is 0 the oxygen atom in the ether moiety is directly bonded attached to the boron atom in the boratobenzene ring.

In one embodiment, $R^{36}$ groups include those that are electron withdrawing in nature such as, for example, fluorinated and perfluorinated hydrocarbyl groups selected from trifluoromethyl, perfluoroethyl, perfluoropropyl, perfluoroisopropyl, pentafluorophenyl and bis(3,5-trifluoromethyl)phenyl.

$R^{37}$ independently represents hydrogen, halogen, perfluorocarbyl, and silylperfluorocarbyl groups, wherein the perfluorocarbyl and silylperfluorocarbyl are as defined previously. In one embodiment, the halogen groups are selected from chlorine, fluorine. In another embodiment, the halogen is fluorine. When $R^{37}$ is halogen, perfluorocarbyl, and/or silylperfluorocarbyl, the group(s) are, in one embodiment, ortho or para to the boron atom in the boratobenzene ring. In another embodiment, when $R^{37}$ is halogen, perfluorocarbyl, and/or silylperfluorocarbyl, the group(s) are para to the boron atom in the boratobenzene ring.

Representative boratobenzene anions include but are not limited to [1,4-dihydro-4-methyl-1-(pentafluorophenyl)]-2- borate, 4-(1,1-dimethyl)-1,2-dihydro-1-(pentafluorophenyl)-2-borate, 1-fluoro-1,2-dihydro-4-(pentafluorophenyl)-2-borate, and 1-[3,5-bis(trifluoromethyl)phenyl]-1,2-dihydro-4-(pentafluorophenyl)-2-borate.

The carborane and halocarborane anions useful as the weakly coordinating counteranion include but are not limited to $CB_{11}(CH_3)_{12}^-$, $CB_{11}H_{12}^-$, $1-C_2H_5CB_{11}H_{11}^-$, $1-Ph_3SiCB_{11}H_{11}^-$, $1-CF_3CB_{11}H_{11}^-$, $12-BrCB_{11}H_{11}^-$, $12-BrCB_{11}H_{11}^-$, $7,12-Br_2CB_{11}H_{10}^-$, $12-ClCB_{11}H_{11}^-$, $7,12-Cl_2CB_{11}H_{10}^-$, $1-H-CB_{11}F_{11}^-$, $1-CH_3-CB_{11}F_{11}^-$, $1-CF_3-CB_{11}F_{11}^-$, $12-CB_{11}H_{11}F^-$, $7,12-CB_{11}H_{11}F_2^-$, $7,9,12-CB_{11}H_{11}F_3^-$, $CB_{11}H_6Br_6^-$, $6-CB_9H_9F^-$, $6,8-CB_9H_8F_2^-$, $6,7,8-CB_9H_7F_3^-$, $6,7,8,9-CB_9H_6F_4^-$, $2,6,7,8,9-CB_9H_5F_5^-$, $CB_9H_5Br_5^-$, $CB_{11}H_6Cl_6^-$, $CB_{11}H_6F_6^-$, $CB_{11}H_6F_6^-$, $CB_{11}H_6I_6^-$, $CB_{11}H_6Br_6^-$, $6,7,9,10,11,12-CB_{11}H_6F_6^-$, $2,6,7,8,9,10-CB_9H_5F_5^-$, $1-H-CB_9F_9^-$, $12-CB_{11}H_{11}(C_6H_5)^-$, $1-C_6F_5-CB_{11}H_5Br_6^-$, $CB_{11}Me_{12}^-$, $CB_{11}(CF_3)_{12}^-$, $Co(B_9C_2H_{11})_2^-$, $CB_{11}(CH_3)_{12}^-$, $CB_{11}(C_4H_9)_{12}^-$, $CB_{11}(C_6H_{13})_{12}^-$, $Co(C_2B_9H_{11})_2^-$, $Co(Br_3C_2B_9H_8)_2^-$ and dodecahydro-1-carbadodecaborate.

Leaving Groups $A^{-1}$ represents an anionic leaving group that can be readily displaced by the weakly coordinating anion that is provided by the WCA salt. The leaving group forms a salt with the cation on the WCA salt. Leaving group A' is selected from halogen (i.e., Br, Cl, I, and F), nitrate, triflate (trifluoromethanesulfonate), triflimide (bistrifluoromethanesulfonimide), trifluoroacetate, tosylate, $AlBr_4^-$, $AlF_4^-$, $AlCl_4^-$, $AlF_3O_3SCF_3^-$, $AsCl_6^-$, $SbCl_6^-$, $SbF_6^-$, $PF_6^-$, $BF_4^-$, $ClO_4^-$, $HSO_4^-$, carboxylates, acetates, acetylacetonates, carbonates, aluminates, and borates.

A more detailed discussion of leaving groups can be found in WO 00/20472, which is hereby incorporated by reference for its teachings regarding leaving groups.

The catalysts of Formula III can be prepared as a preformed single component catalyst in solvent or can be prepared in situ by admixing the catalyst precursor components in the desired monomer to be polymerized.

The catalyst of Formula III can be prepared by admixing the catalyst precursors in an appropriate solvent, allowing the reaction to proceed under appropriate temperature conditions, and isolating the catalyst product. In another embodiment, a Group 10 metal pro-catalyst is admixed with a Group 15 electron donor compound and/or a labile neutral electron donor compound, and a salt of a weakly coordinating anion in an appropriate solvent to yield the preformed catalyst complex set forth under Formula III above. In another embodiment a Group 10 metal pro-catalyst containing a Group 15 electron donor ligand is admixed with a salt of a weakly coordinating anion in an appropriate solvent to yield the preformed catalyst complex.

The catalyst preparation reactions are carried out in solvents that are inert under the reaction conditions. Examples of solvents suitable for the catalyst preparation reaction include but are not limited to alkane and cycloalkane solvents such as pentane, hexane, heptane, and cyclohexane; halogenated alkane solvents such as dichloromethane, chloroform, carbon tetrachloride, ethylchloride, 1,1-dichloroethane, 1,2-dichloroethane, 1-chloropropane, 2-chloropropane, 1-chlorobutane, 2-chlorobutane, 1-chloro-2-methylpropane, and 1-chloropentane; ethers such as THF and diethylether; aromatic solvents such as benzene, xylene, toluene, mesitylene, chlorobenzene, and o-dichlorobenzene; and halocarbon solvents such as Freon® 112; and mixtures thereof. In one embodiment, solvents include, for example, benzene, fluorobenzene, o-difluorobenzene, p-difluorobenzene, pentafluorobenzene, hexafluorobenzene, o-dichlorobenzene, chlorobenzene, toluene, o-, m-, and p-xylenes, mesitylene, cyclohexane, THF, and dichloromethane.

A suitable temperature range for carrying out the reaction is from about −80° C. to about 150° C. In another embodiment, the temperature range for carrying out the reaction is from about −40° C. to about 100° C. In yet another embodiment, the temperature range for carrying out the reaction is from about 0° C. to about 65° C. In still yet another embodiment, the temperature range for carrying out the reaction is from about 10° C. to about 40° C. Pressure is not critical but may depend on the boiling point of the solvent employed, i.e. sufficient pressure to maintain the solvent in the liquid phase. Reaction times are not critical, and can range from several minutes to 48 hours. In one embodiment, the reactions are carried out under inert atmosphere such as nitrogen or argon.

The reaction is carried out by dissolving the pro-catalyst in a suitable solvent and admixing the appropriate ligand(s) and the salt of the desired weakly coordinating anion with the dissolved pro-catalyst, and optionally heating the solution until the reaction is complete. The preformed single component catalyst can be isolated or can be used directly by adding aliquots of the preformed catalyst in solution to the polymerization medium. Isolation of the product can be accomplished by standard procedures, such as evaporating the solvent, washing the solid with an appropriate solvent, and then recrystallizing the desired product. The molar ratios of catalyst components employed in the preparation the preformed single component catalyst of the invention is based on the metal contained in the pro-catalyst component. In one embodiment, the molar ratio of pro-catalyst/Group 15 electron donor component/WCA salt is 1:1–10:1–100. In another embodiment, the molar ratio of pro-catalyst/Group 15 electron donor component/WCA salt is 1:1–5:1–20. In yet another embodiment, the molar ratio of pro-catalyst/Group 15 electron donor component/WCA salt is 1:1–2:1–5. In embodiments of the invention where the pro-catalyst is ligated with a Group 15 electron donor ligand and/or a labile neutral electron donor ligand the molar ratio of pro-catalyst (based on the metal content) to WCA salt is 1:1–100. In another embodiment, this ratio is 1:1–20. In yet another embodiment, this ratio is 1:1–5.

Embodiments of the catalyst devoid of a hydrocarbyl containing ligand can be synthesized by reacting a pro-catalyst of the formula $[M(A')_2]$ with the desired ligands and WCA salt in accordance with the following reaction scheme:

$[M(A')_2]+xL'+2[WCA]$ salt □ $[M(L')_x]$ $[WCA]_2+2A'$ salt wherein x=1 or 2, M, and L' are as previously defined.

Examples of pro-catalyst compounds include palladium (II) bis(acetylacetonate), palladium (acetate)$_2$, $Pd(NO_3)_2$, $PdCl_2$, $PdBr_2$, and $PdI_2$.

The foregoing schematic equation has been presented for illustrative purposes only, other illustrative equations can be found in WO/0020472. While they have been written in balanced form, it should be recognized that an excess of reaction components can be employed without deviating from the spirit of invention. For example, an excess of L', L", A', or WCA salt containing components can be employed in the process of the invention so long as the process is not deleteriously affected.

In a one embodiment the molar ratio of the Group 10 metal/Group 15 electron donor compound/source of a weakly coordinating anion/organometallic compound is 1:1–10:1–100:2–200. In another embodiment, the molar ratio of the Group 10 metal/Group 15 electron donor compound/source of a weakly coordinating anion/ organometallic compound is 1:1–5:1–40:4–100. In yet another embodiment, the molar ratio of the Group 10 metal/Group 15 electron donor compound/source of a weakly coordinating anion/organometallic compound is 1:1–2:2–20:5–50. In embodiments where the Group 10 metal ion source is an adduct containing a Group 15 electron donor compound, no additional Group 15 electron donor compound need be employed. In this embodiment the molar ratio of the Group 10 metal/Group 15 electron donor compound/source of a weakly coordinating anion/ organometallic compound is 1:0:2–20:5–50.

The optimum temperature for the present invention is dependent on a number of variables, primarily the choice of catalyst and the choice of reaction diluent. Thus, for any given polymerization the optimum temperature will be experimentally determined taking these variables into account.

In general the polymerization reactions can be conducted in any suitable solvent in the presence of any of the catalsyts of the invention at a temperature range from about 0° C. to about 140° C., or from 20° C. to about 130° C., or even from about 25° C. to about 125° C. In another embodiment, the reaction is conducted in any suitable solvent at a temperature in the range of about 70° C. to about 130° C. In still another embodiment, the reaction is conducted in any suitable solvent at a temperature in the range of about 15° C. to about 45° C.

In one aspect of the invention reactions utilizing the disclosed catalysts are carried out in an organic solvent which does not adversely interfere with the catalyst system and is a solvent for the monomer. Examples of organic solvents are aliphatic (non-polar) hydrocarbons such as pentane, hexane, heptane, octane and decane; alicyclic hydrocarbons such as cyclopentane and cyclohexane; aromatic hydrocarbons such as benzene, chlorobenzene, o-dichlorobenzene, toluene, methoxybenzene and xylenes; ethers such as methyl-t-butyl ether and anisole; halogenated (polar) hydrocarbons such as methylene chloride, chloroform, carbon tetrachloride, ethyl chloride, 1,1-dichloroethane, 1,2-dichloroethane, 1,2-dichloroethylene, 1-chloropropane, 2-chloropropane, 1-chlorobutane, 2-chlorobutane, 1-chloro-2-methylpropane, and 1-chloropentane.

The choice of reaction solvent is made on the basis of a number of factors including the choice of catalyst and whether it is desired to run the polymerization as a slurry or solution process. One of ordinary skill in the art will readily be able to determine which solvent is suitable for use in polymerizing the above-mentioned monomer combinations given a number of factors which include, but are not limited to, the exact nature of the monomers to be polymerized, the catalyst utilized in the polymerization reaction, and the temperature and/or pressure at which the polymerization process is to be conducted.

The molar ratio of total monomer to Group 8, 9, or 10 transition metal in the catalysts set for the under Formula III can range from about 2:1 to about 100,000:1, or from about 5:1 to about 20,000:1, or from about 100:1 to about 10,000, or even from about 10:1 to about 2,000:1. In another embodiment, the molar ratio of total monomer to Group 8, 9 or 10 metal ranges from about 2:1 to about 1000:1, or from about 5:1 to about 500:1, or even from about 10:1 to about 250:1.

The polymers obtained by the process of the present invention are produced in a molecular weight ($M_n$) range from about 500 to about 1,000,000, or from about 2,000 to about 700,000, or from about 3,000 to about 100,000, or even still from about 3,000 to about 50,000.

Molecular weight can be controlled by changing the catalyst to monomer ratio. Lower molecular weight polymers and oligomers may also be formed in the range from about 500 to about 500,000 by carrying out the polymerization in the presence of a chain transfer agent. Macromonomers or oligomers comprising from about 4 to about 50 repeating units can be prepared in the presence of a CTA (Chain Transfer Agent) selected from a compound having a terminal olefinic double bond between adjacent carbon atoms, wherein at least one of the adjacent carbon atoms has two hydrogen atoms attached thereto. The CTA is exclusive of styrenes (non-styrenes), vinyl ethers (non-vinyl ether) and conjugated dienes. By non-styrenic, non-vinyl ether is meant that compounds having the following structures are excluded from the chain transfer agents of this invention:

$CH_2$=C(A)(R or H), and

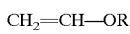
$CH_2$=CH—OR wherein A is an aromatic substituent and R is hydrocarbyl.

In one embodiment, the CTA compounds of this invention are represented by the following formula:

$CH_2$=C($R^{16}$)($R^{17}$)

wherein $R^{16}$ and $R^{17}$ above are independently represent hydrogen, branched or unbranched ($C_1$ to $C_{40}$) alkyl, branched or unbranched ($C_2$ to $C_{40}$) alkenyl, or halogen.

In one embodiment, the CTAs utilized in the present invention are α-olefins having 2 to 10 carbon atoms (e.g., ethylene, propylene, 4-methyl-1-pentene, 1-hexene, 1-decene, 1,7-octadiene, and 1,6-octadiene, or isobutylene).

Also useful as CTA are $C_3$ to $C_{12}$ cyclic olefins (e.g., cyclopentene).

The CTA can be employed in an amount ranging from about 0.10 mole % to over 50 mole % relative to the moles of total NB-type monomer. In one embodiment, the CTA is employed in the range of 0.10 to 10 mole %. In another embodiment, the CTA is employed in the range of from 0.1 to 5.0 mole %. As discussed above, depending on catalyst type and sensitivities, CTA efficiencies and desired end group, the concentration of CTA can be in excess of 50 mole % (based on total NB-functional monomer present), e.g., 60 to 80 mole %. Higher concentrations of CTA (e.g., greater than 100 mole %) may be necessary to achieve the low molecular weight embodiments of this invention such as in oligomer and macromonomer applications. Besides chain transfer, the process of the present invention affords a way by which a terminal α-olefinic end group can be placed at the end of a polymer chain.

Polymers of the present invention that are prepared in the presence of the instant CTA's have molecular weights ($M_n$) ranging from about 500 to about 500,000, or from about 2,000 to about 300,000, or even from about 5,000 to about 200,000.

The polymers prepared in the presence of the catalysts and/or the CTA's of the present invention contain unsaturation at one or both of the teminal ends of the polymer chain. The position of the terminal unsaturation contained on the polymer chain depends on the type of chain transfer agent employed in the polymerization reaction. When employed with the transition metal catalysts used to polymerize the polycyclic olefin monomers herein, the chain transfer agents append exclusively as a terminal end group on each polycyclic polymer chain. The chain transfer agents do not copolymerize into the backbone of the polymer. By terminal end group is meant that the terminal group on at least one of the terminal ends of the polycyclic polymer chain contains an end group moiety derived from the chain transfer agent utilized in the polymerization reaction. Schematically, the terminally unsaturated polymers prepared in the presence of a chain transfer agent can be represented as follows:

PNB-CTA wherein PNB represents the polycylic polymer chain comprising one or more repeating units selected from Formulae I' and II' set forth above, and CTA represents a chain transfer agent moiety that is covalently bonded to a terminal end of the PNB backbone. For example, if an α-olefin such as ethylene is employed as a chain transfer agent, the terminal group unsaturation in the polymer backbone can be represented as follows:

PNB-$CH_2$=$CH_2$

In instances where a longer chain α-olefin, e.g., 1-hexene is utilized as the chain transfer agent the polymer backbone can be schematically represented as follows:

PNB-$CH_2$=$CH_2$—$CH_2$—$CH_2$—$CH_2$—$CH_3$

It is to be noted that for longer chain α-olefin chain transfer agents ($C_3$ and above) the double bond in the chain transfer agent can rearrange to another position in the carbon chain to give a variety of unsaturated isomers. For example, the double bond in the schematic formulae above for the appended hexenyl moiety can rearrange between carbon atoms 2 and 3, carbon atoms 3 and 4 and carbon atoms 4 and 5, wherein carbon 1 is proximal to the PNB chain and carbon 6 is distal to the PNB chain.

This terminal group unsaturation increases the optical density of the polymer, which is deleterious to lithographic imaging. As discussed herein the terminal unsaturation contained in the appended chain transfer moiety can be removed via post-functionalization of the olefinic end groups by, for example, epoxidation, hydrogenation, hydroformylation, hydrosilation and/or cyclopropanation. Treatment of the terminally unsaturated end groups with the post-functionalization agents of the invention yields polycyclic polymers having hydrogenated, hydroformylated, hydrosilated and epoxidized end groups. The post-functionalization agents add across the double bond contained in the terminally unsaturated end groups which are appended to a terminal end of the polycylic polymer. Methods for treating terminal unsaturation in polycycloolefins are disclosed in U.S. Pat. No. 6,294,616 which is incorporated herein in its entirety In one embodiment of the invention, the terminal unsaturation present at a terminal end of the polymer backbone can be hydrogenated in the presence of hydrogen and a hydrogenation catalyst. Any homogeneous or heterogeneous hydrogenation catalyst can be employed as long as it does not deleteriously affect the polymer backbone. Examples of suitable hydrogenation catalysts are $H_2PtCl_4$ (chloroplantinic acid) RuHCl($Ph_3$)$_3$, RhCl($Ph_3$)$_3$ (Wilkinson's Catalyst) and [Ir(1,5-cyclooctadiene)(P(cyclohexyl)$_3$)(pyridine)] $PF_6$ (Crabtree's Catalyst). In addition, it is contemplated that the palladium metal containing catalysts disclosed under Formula III herein can be employed as hydrogenation catalysts in the presence of hydrogen. The catalyst is employed in an amount of from about 0.01 to about 2.5% w/w based on the polymer and in another aspect about 1.9% based on the polymer. The polymer is isolated from the reaction medium following the polymerization reaction and then hydrogenated in a suitable solvent (e.g., toluene, benzene, tetrahydrofuran, methylene chloride) in the presence of hydrogen and the hydrogenation catalyst. Hydrogen is employed over the reaction medium at a pressure of 1 to 500 psi in one aspect of the invention and 50 to 90 psi in another. In one aspect of the invention, the polymer is hydrogenated at a temperature of from about 22 to 100° C. and 70 to 75° C. in another aspect. The hydrogenation reaction is conducted for about 10 to about 72 hours in one aspect of the invention and 10 to about 15 hours in another aspect The double bond in the terminal olefinic end group is hydrogenated to yield a hydrogenated end group on one or both terminal ends of the polycyclic polymer.

In another embodiment, the terminal unsaturation present at a terminal end of the polymer backbone can be hydrosilated in the presence of hydrosilation catalyst and a silane post-functionalization agent. Any homogeneous or heterogeneous hydrosilation catalyst can be employed as long as it does not deleteriously affect the polymer backbone. Examples of suitable hydrosilation catalysts are $H_2PtCl_4$ (chloroplantinic acid), RhCl($Ph_3$)$_3$ (Wilkinson's Catalyst) and [Ir(1,5-cyclooctadiene) (P(cyclohexyl)$_3$)(pyridine)] $PF_6$ (Crabtree's Catalyst). Examples of silane post-functionalizaion agents include ($C_1$–$C_{10}$) trialkyl silanes (e.g., triethylsilane, tri(n-propylsilane) and pentamethyldisiloxane. The hydrosilation catalyst is employed in an amount of from about 0.01 to about 2.5% w/w based on the polymer in one aspect of the invention and about 2 5 w/w in another aspect. The hydrosilation agent can be employed in an amount of from 1 to 20 molar equivalents or 2.0 to 39% w/w (based on the polymer). The polymer is isolated from the reaction medium following the polymerization reaction and then hydrosilated in a suitable solvent (e.g., toluene, benzene, tetrahydrofuran, methylene chloride) in the presence of the hydrogenation catalyst and the silane post-functionalization agent. The polymer is reacted at a temperature of from about 22 to 100° C. in one aspect of the invention and at about 60 to 65° C. in another aspect. The reaction times range from about 10 to about 240 hours in one aspect of the invention. In another aspect, reaction times can range from about 10 to 15 hours. The double bond in the terminal olefinic end group is hydrosilated to yield a hydrosilated end group on one or both terminal ends of the polycyclic polymer.

In another embodiment the terminal unsaturation present at a terminal end of the polymer backbone can be epoxidized in the presence of a peracid acid post-functionalization agent. In one aspect of the invention the peracid is a mixture of glacial acetic acid and hydrogen peroxide in a ratio of from about 5:1 to about 1:5 (volume %). In another aspect, the ratio of acetic acid to hydrogen peroxide is 1:1. The polymer is isolated from the reaction medium following the polymerization reaction and dissolved in a suitable solvent (e.g., toluene) at a concentration of from about 5 to 30 wt. % (polymer in solvent). The ratio of polymer solution to peracidic acid can range from about 5:1 to about 1:1 in one aspect, and from about 2:1 to about 1:1 in another aspect of the invention. The peracid treated polymer solution is heated to from about 50 to about 100° C. in one aspect of the invention, and from about 80 to about 90° C. in another aspect. The reaction can be conducted for a period of from about 0.5 to 5 hours in one aspect of the invention and about 1 hour in another aspect. The double bond in the terminal olefinic end group is epoxidized to yield an oxirane end group on a terminal end of the polycyclic polymer. It should be noted that the oxirane ring can be ring-opened to yield hydroxy derivatives of the oxirane moiety.

Again, it should be recognized that for longer chained terminal end groups (such as hexenyl groups as discussed above) several unsaturated isomers exist depending on the extent of the rearrangement of the double bond. Accordingly, the epoxidation reaction can occur across several different carbon atoms depending on where the double bond is located.

Catalyst Preparation Examples

Catalyst A:

Palladium(II) acetate (0.20 g, 0.89 mmol) is dissolved in methylene chloride (3 mL) and is cooled to −35° C. Tri-i-propylphosphine (0.29 g, 1.8 mmol) is dissolved in cyclohexane (7 mL) and is cooled to −35° C. This solution is then slowly added to the palladium solution. The color of the palladium solution changes from red to yellow-orange. Next, the solution is concentrated and then placed in a freezer at −35° C. Yellow crystals eventually form which can be isolated and dried in vacuo. The yield is 0.35 g (72%).

Figure 2:
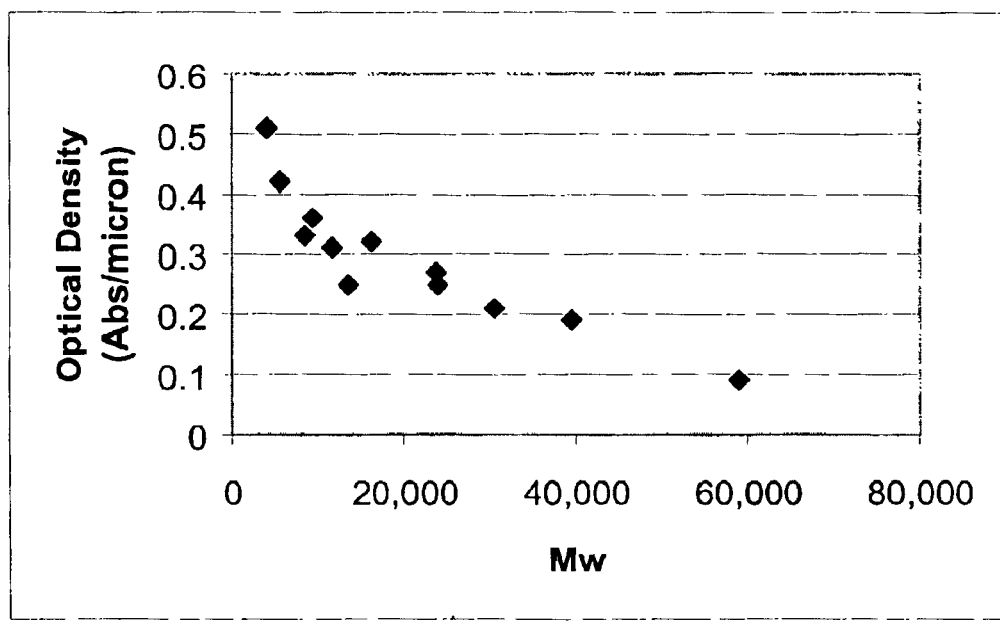
FIG. 2 is a plot of optical density (OD) versus Mw for homopolymers of α,α-bis(trifluoromethyl)bicyclo[2.2.1]hept-5-ene-2-ethanol produced using a palladium catalyst.

Data: $^1$H NMR ($C_6D_6$): 2.08 (br septet, 6H), 2.00 (s, 6H), 1.32 (q, 36H) ppm; and $^{31}$P NMR ($C_6D_6$): 32.8 (s) ppm. Analysis of $C_{22}H_{48}O_4P_2Pd$ yields: C, 48.07; H, 8.63. The calculated values are as follows: C, 48.48; H, 8.81. A suitable crystal is subjected to X-ray diffraction analysis. The results of this analysis are shown in FIG. 2. Based on the foregoing one is able to determine that Catalyst A comprises trans-bis(tri-i-propylphosphine)palladium diacetate.

Catalyst B:

Palladium(II) acetate (0.20 g, 0.89 mmol) and solid tricyclohexylphosphine (0.50 g, 1.8 mmol) are added together and then dissolved in methylene chloride (3 mL). As a result, a yellow solution is yielded and a yellow solid starts to precipitate. The solution is then stored in a freezer at −35° C. overnight. Thereafter, the yellow solid is collected by filtration and washed with cyclohexane (3×10 mL) and dried in vacuo. The yield is 0.5 g (72%).

Data: $^1$H NMR ($C_6D_6$): 2.20 (br d, 14H), 2.13 (s, 6H), 2.00 (br s, 8H), 1.81 (br s, 26H), 1.62 (s, 8H), 1.23 (s, 10 H) ppm; and $^{31}$P NMR ($C_6D_6$): 22.9 (s) ppm. Analysis of $C_{40}H_{72}O_4P_2Pd$ yields: C, 61.14; H, 8.66. The calculated values are as follows: C, 61.17; H, 9.24. Based on the foregoing one is able to determine that Catalyst B comprises trans-bis(cyclohexylphosphine)palladium diacetate.

Catalyst C:

Palladium(II) acetate (1.00 g, 4.46 mmol) is dissolved in methylene chloride and i-propyldiphenylphosphine (2.03 g, 8.92 mmol) is dissolved in a 50:50 mixture of methylene chloride and pentane. Both solutions are cooled to −35° C. and then the phosphine solution is added to the palladium solution. The mixture is allowed to stir for 3 hours at −35° C. An orange solution develops with a yellow insoluble material dispersed throughout. The solvents are decanted. The solids are washed with pentane and dried under vacuum. The yield is 2.03 g.

Data: $^1$H NMR ($CD_2Cl_2$): 7.71 (m, 8H), 7.45 (m, 12H), 2.75 (m, 2H), 1.36 (s, 6H), 1.13 (d of t, 12H), $^{31}$P NMR ($CD_2Cl_2$): 26.9 (s) ppm. The analytical data are consistent with the formation of bis(i-propyldiphenylphosphine) palladium diacetate.

Catalyst D:

Palladium(II) acetate (0.500 g, 2.23 mmol) is mixed with diethylether and methylene chloride and is cooled to −35° C. To this solution is added 1.06 g of tricyclopentylphosphine (4.45 mmol) in hexane (4 mL). As a result, the solution turns yellow and is stored at −35° C. for 3 days. Thereafter, the solution is filtered and the solvent is removed in vacuo to yield a yellow powder. The yield is 1.05 g (68%).

Data: $^1$H NMR (toluene-$d_8$): 1.98 (br s), 1.89 (s), 1.69 (br s), 1.46 (br s) ppm; and $^{31}$P NMR (toluene-$d_8$): 23.4 (s) ppm.

Catalyst E:

Palladium(II) acetate (0.500 g, 2.23 mmol) and tribenzylphosphine (1.36 g, 4.46 mmol) are mixed in about 10 mL of methylene chloride under nitrogen. As a result, a yellow solution is yielded which is then filtered. Next, about 20 mL of pentane is added and the mixture is cooled to −35° C. As a result, yellow crystals are obtained. The solvent is decanted from the crystals which are dried in vacuo. The yield is 0.70 g (38%).

Data: $^1$H NMR ($CDCl_3$): 7.41 (m, 12H), 7.26 (m, 18H), 3.08 (s, 12H), 1.52 (s, 6H) ppm; and $^{31}$P NMR ($CDCl_3$): 15.6 (s) ppm.

Catalyst F:

Palladium(II) acetate (0.500 g, 2.23 mmol) and cyclohexyldiphenylphosphine (1.19 g, 4.45 mmol) are each dissolved in about 3 mL of methylene chloride. The two solutions are combined at −30° C. and subjected to vigorous shaking. As a result, a bright yellow solid precipitates from solution. The solvent is decanted and the yellow solid is washed with pentane. The yield is 1.70 g.

Data: $^1$H NMR ($CD_2Cl_2$): 7.67 (m, 8H), 7.42 (m, 12H), 2.43 (t, 2H), 2.11 (d, 4H), 1.67 (d, 4H), 1.59 (d, 2H), 1.39 (s, 6H), 1.28 (m, 4H), 0.94 (m, 6H) ppm; and $^{31}$P NMR ($CD_2Cl_2$): 23.3 (s) ppm.

Catalyst G:

Palladium(II) acetate (1.00 g, 4.46 mmol) is dissolved in methylene chloride and di-i-propylphenylphosphine (1.73 g, 8.90 mmol) is dissolved in methylene chloride:pentane 50:50. The two solutions are combined at −35° C. and stirred. A red solution formed which is filtered and layered with pentane. After 18 hours, yellow crystals formed which are isolated, washed with pentane, and dried under vacuum. The yield was 1.20 g (44%).

Data: $^1$H NMR ($CD_2Cl_2$): 7.73 (m, 4H), 7.40 (m, 6H), 2.38 (m, 4H), 1.38 (d of d, 12H), 1.33 (s, 6H), 1.18 (d of d, 12H) ppm. $^{31}$P NMR ($CD_2Cl_2$): 29.5 (s) ppm.

Catalyst H:

Palladium(II) acetate (0.50 g, 0.0022 mol) is dissolved in methylene chloride. Tri-i-butylphosphine (0.90 g, 0.0045 mol) is dissolved in hexane. Both solutions are cooled to −35° C. Then the phosphine solution is added to the palladium solution at −35° C. The mixture remained at −35° C. for 2 hours and then is allowed to warm to room temperature. The solution is then filtered to give a bright orange solution. All solvents are then removed under vacuum. The resulting orange powder is dissolved in pentane then concentrated to about 5 mL. A yellow solid is formed. The solution is decanted and the solid is dried under vacuum. The yield is 0.57 g (39%).

Data: $^1$H NMR ($CD_2Cl_2$): 2.27 (m, 6H), 2.01 (s, 6H), 1.59 (m, 12H), 1.16 (d, 36H). $^{31}$P NMR ($CD_2Cl_2$): 5.6 (s) ppm.

Catalyst I:

Palladium(II) acetate (0.50 g, 0.0022 mol) is dissolved in methylene chloride. Di-t-butylmethoxyphosphine (0.78 g, 0.0.045 mol) is dissolved in pentane. Both solutions are cooled to −35° C. Then the phosphine solution is added to the palladium solution at −35° C. The solution is stored at −35° C. from which yellow crystals form. The yield 0.80 g (62%).

Data: $^1$H NMR ($CD_2Cl_2$): 3.86 (s, 6 H), 1.77 (s, 6H), 1.37 (s, 24H). $^{31}$P NMR ($CD_2Cl_2$): 142.6 (s) ppm.

Catalyst J:

Palladium(II) acetate (0.50 g, 0.0022 mol) is dissolved in methylene chloride (3.5 mL). Dicyclohexylmethoxyphosphine (1.02 g, 0.0.0446 mol) is dissolved in pentane (10 mL). Both solutions are cooled to −35° C. Then the phosphine solution is added to the palladium solution at −35° C. The solution is stored at −35° C. for 18 h. Then 30 mL of pentane is added to the mixture. After 64 hour, yellow crystals form. The yield is 1.10 g (73%).

Data: $^1$H NMR (CD$_2$Cl$_3$): 3.85 (virtural triplet, 6H), 2.08 (m, 2H), 1.95 (m, 4H), 1.84 (s, 6H), 1.82 (m, 4H), 1.71 (s, 2H), 1.65 (m, 2H), 1.48 (m, 2H), 1.25 (m, 6H). $^{31}$P NMR (CD$_2$Cl$_3$): 129.1 (s) ppm.

POLYMERIZATION EXAMPLES

Although the discussion above centers around the following catalysts: trans-bis(tri-i-propylphosphine)palladium diacetate (also known as Pd(acetate)$_2$ (tri-isopropylphosphine)$_2$); trans-bis(cyclohexylphosphine) palladium diacetate; trans-bis(i-propyldiphenyl-phosphine) palladium diacetate; trans-bis(tricyclohexylphosphine) palladium diacetate (also known as Pd(acetate)$_2$ (tricyclohexylphosphine)$_2$); trans-bis(tribenzylphosphine) palladium diacetate; and trans-bis (cyclohexyldiphenylphosphine)palladium diacetate, other catalysts such as ($\eta^6$-toluene)Ni(C$_6$F$_5$)$_2$, as discussed above, are within the scope of the present invention.

If utilized, suitable cocatalysts for the above-mentioned palladium catalysts are salts of weakly coordinating anions, and include, but are not limited to, lithium tetrakis (pentafluorophenyl)borate.2.5 Et$_2$O (etherate), sodium tetrakis(bis-3,5-trifluoromethylphenyl)borate, and N,N-dimethylanilinium tetrakis(pentafluorophenyl)borate.

The polymerization examples which follow detail just a few of the embodiments within the scope of the present invention. That is, the following examples describe the polymerization of one or more monomers according to the present invention utilizing one of the catalyst systems set forth above. It should be noted, that the present invention is not restricted to the Examples set forth below. Rather, the examples are just are representative sample of the polymerization methods disclosed by the present invention.

Example 1

Initially, α,α-bis(trifluoromethyl)bicyclo[2.2.1]hept-5-ene-2-ethanol (12.0 g, 43.8 mmol) and 1-hexene (0.92 g, 10.9 mmol, 20 mole percent based on the moles of monomer) are weighed and combined in a glass vial. To this solution is added 18 mL of anisole. A stock solution of 0.0069 g of trans-bis(tricyclohexylphosphine)palladium diacetate (0.0088 mmol, Catalyst B) and 0.035 g N,N-dimethylanilinium tetrakis(pentafluorophenyl)borate (0.44 mmol) in 10 mL of anisole is made. A one milliliter portion of this solution is added to above-mentioned monomer/1-hexene solution. Next, this mixture is heated at 120° C. for 91 hours. Thereafter, the polymer is precipitated by pouring the reaction mixture into hexane. The precipitated polymer is filtered and dried at 90° C. in a vacuum oven. The conversion is determined gravimetrically. The polymer's molecular weight is determined by GPC methods in THF using poly(styrene) as a standard. See Table 1 below for the results.

Examples 2 to 6

Examples 2 to 6 are identical in nature to Example 1 except that the mole percent of 1-hexene is varied as noted in Table 1. The results from Examples 2 to 6 are also detailed below in Table 1.

TABLE 1

Homopolymerization of α,α-bis(trifluoromethyl) bicyclo[2.2.1]hept-5-ene-2-ethanol

| Example | Mol. % of 1-hexene | Conversion Percentage | Mw | Mn | Mw/Mn |
|---|---|---|---|---|---|
| 1 | 20 | 84 | 39,562 | 8,590 | 4.61 |
| 2 | 30 | 85 | 23,929 | 5,929 | 4.04 |
| 3 | 40 | 86 | 16,251 | 4,607 | 3.53 |
| 4 | 50 | 83 | 11,651 | 3,837 | 3.04 |
| 5 | 55 | 80 | 9,429 | 3,451 | 2.73 |
| 6 | 60 | 70 | 8,549 | 3,771 | 2.27 |

In view of the results obtained from Examples 1 to 6, these examples demonstrate that the molecular weight decreases as the concentration of 1-hexene increases for homopolymers of α,α-bis(trifluoromethyl)bicyclo[2.2.1]hept-5-ene-2-ethanol.

Example 7

Initially, α,α-bis(trifluoromethyl)bicyclo[2.2.1]hept-5-ene-2-ethanol (7.68 g, 28.0 mmol), t-butylester of 5-norbornene carboxylic acid (2.33 g, 12.0 mmol) and 1-hexene (0.84 g, 10 mmol, 20 mole percent based on the moles of monomer) are weighed and combined in a glass vial. To this solution is added 18 mL of anisole. Next, stock solutions of 0.0031 g of trans-bis(tricyclohexylphosphine) palladium diacetate (0.040 mmol, Catalyst B) and 0.17 g lithium tetrakis (pentafluorophenyl)borate.2.5 etherate (0.20 mmol) each in 5 mL of anisole are prepared. A one milliliter aliquot of each solution is added to the above monomer/1-hexene solution. This mixture is heated at 95° C. for 23 hours. Thereafter, the polymer is precipitated by pouring the reaction mixture into hexane. Then, the precipitated polymer is filtered and dried at 70° C. in a vacuum oven. The conversion is determined gravimetrically. The polymer's molecular weight is determined by GPC methods in THF using poly(styrene) as a standard. See Table 2 below for the results.

Examples 8 to 10

Examples 8 to 10 are identical in nature to Example 7 except that the mole percent of 1-hexene is varied as noted in Table 2. The results from Examples 8 to 10 are also detailed below in Table 2

TABLE 2

Copolymerization of α,α-bis(trifluoromethyl)bicyclo[2.2.1]hept-5-ene-2-ethanol and t-butylester of 5-norbornene carboxylic acid (acid labile comonomer)

| Example | Mole % of 1-hexene | Conversion Percentage | Mw | Mn | Mw/Mn |
|---|---|---|---|---|---|
| 7 | 20 | 61 | 37,200 | 13,200 | 2.81 |
| 8 | 30 | 60 | 28,600 | 11,700 | 2.44 |
| 9 | 40 | 60 | 18,900 | 8,500 | 2.21 |
| 10 | 50 | 59 | 14,400 | 7,000 | 2.06 |

In view of the results obtained from Examples 7 to 10, these examples demonstrate that the molecular weight decreases as the concentration of 1-hexene increases for copolymers of α,α-bis(trifluoromethyl)bicyclo[2.2.1]hept-5-ene-2-ethanol and t-butylester of 5-norbornene carboxylic acid.

Example 11

Initially, α,α-bis(trifluoromethyl)bicyclo[2.2.1]hept-5-ene-2-ethanol (1.37 g, 5.00 mmol) and cyclopentene (0.036 g, 0.53 mmol, 10 mole percent based on the moles of monomer) are weighed and combined in a glass vial. This solution is then diluted with sufficient anisole to make the monomer concentration equal to 2 M. A 100 μmL aliquot of a 0.002 M stock solution of palladium bis (tricyclopentylphosphine) di(acetate) (Catalyst B) in anisole and a 100 μL of a 0.01 M stock solution of N,N-dimethylanilinium tetrakis(pentafluorophenyl)borate in anisole are added to the above monomer solution. Next, this mixture is heated at 125° C. for 18 hours. Thereafter, the polymer is precipitated by pouring the reaction mixture into pentane. The precipitated polymer is then filtered and dried in a vacuum oven. The conversion is determined gravimetrically. The polymer's molecular weight is determined by GPC methods in THF using poly(styrene) as a standard. See Table 3 below for the results.

Examples 12 and 13

Examples are identical in nature to Example 11 except that the mole percent of cyclopentene is varied as noted in Table 3. The results from Examples 12 and 13 are also detailed below in Table 3.

TABLE 3

Polymerization of α,α-bis(trifluoromethyl)bicyclo[2.2.1]hept-5-ene-2-ethanol

| Example | Mol. % of cyclopentene | Conversion Percentage | Mw | Mn | Mw/Mn |
|---|---|---|---|---|---|
| 11 | 10 | 66 | 44,500 | 9,900 | 4.49 |
| 12 | 20 | 65 | 20,100 | 6,770 | 2.97 |
| 13 | 40 | 47 | 12,100 | 5,560 | 2.14 |

In view of the results obtained from Examples 11 to 13, these examples demonstrate that the molecular weight decreases as the concentration of cyclopentene increases for homopolymers of α,α-bis(trifluoromethyl) bicyclo[2.2.1]hept-5-ene-2-ethanol.

Example 14

Initially, α,α-bis(trifluoromethyl)bicyclo[2.2.1]hept-5-ene-2-ethanol (100 g, 365 mmol) and 1-hexene (37.5 g, 450 mmol, 55 mole percent based on the moles of monomer) are weighed and combined in a glass vial. Next, 0.0057 g of palladium bis(tricyclohexylphosphine) di(acetate) (0.0073 mmol, Catalyst B) and 0.029 g N,N-dimethylanilinium tetrakis(pentafluorophenyl)borate (0.037 mmol) were added to the above solution. This mixture is diluted with sufficient anisole to yield a 2.5 M solution of monomer and then heated at 120° C. for 64 hours. Thereafter, the polymer is precipitated by pouring the reaction mixture into hexane. The precipitated polymer is filtered and dried at 70° C. in a vacuum oven. Next, the polymer is re-dissolved in 250 mL of methylene chloride. This solution is added to heptane to precipitate the polymer. The resulting solid is filtered and dried in a vacuum oven at 75° C. The polymer is then re-dissolved in 150 mL of MeOH and heated at 60° C. for 12 hours. This solution is then sequentially filtered through 5 micron, 1 micron, 0.45 micron, 0.22 micron, and 0.1 micron filters. Thereafter, the polymer is precipitated by adding to the polymer/MeOH solution sufficient water to yield a 75:25 mixture of water and methanol. The isolated yield is 60 g (60%). The polymer's molecular weight is determined by GPC methods in THF using poly(styrene) as a standard: Mw=10,500; Mn=5130. The $^1$H NMR (CDCl$_3$/DMSO-d$_6$) spectrum of the polymer exhibits resonances between about 5.3 and 4.9 ppm consistent with olefinic end groups.

The lower molecular weight portion of this polymer is fractionated by preparative SEC (size exclusion chromatography) using THF as the mobile phase and a Plgel, Guard (5μ, 50×4.6 mm)+Mixed-E (3μ, 300×4.6 mm column set) and is analyzed by MALDI-TOF MS (matrix assisted laser desorption time-of-flight mass spectrometry, Bruker Reflex III instrument, reflectron and linear mode, positive ion spectra). Interpretation of MALDI-TOF MS results are consistent with the formation of a polymer with hexenyl end groups.

In view of the above results, Example 14 demonstrates that the homopolymers of α,α-bis(trifluoromethyl)bicyclo[2.2.1]hept-5-ene-2-ethanol made with palladium catalysts in the presence of 1-hexene as a chain transfer agent have appended to one end of the polymer chain a hexenyl end group.

Example 15

Initially, α,α-bis(trifluoromethyl)bicyclo[2.2.1]hept-5-ene-2-ethanol (25 g, 91 mmol) and cyclopentene (2.7 g, 39 mmol, 30 mole percent based on the moles of monomer) are weighed and combined in a glass vial. This solution is diluted with sufficient anisole to yield a monomer concentration equal to 1.5 M. A 500 μL aliquot of a stock anisole solution of Catalyst C (0.005 g in 2 mL of anisole) and 0.0073 g of N,N-dimethylanilinium tetrakis(pentafluorophenyl)borate (0.0091 mmol) in anisole are added to the above monomer solution. This mixture is then heated at 80° C. for 18 hours. Thereafter, the polymer is precipitated by pouring the reaction mixture into hexane. The precipitated polymer is then filtered and dried in a vacuum oven. The yield is 14.1 g (56%). The polymer's molecular weight is determined by GPC methods in THF using poly(styrene) as a standard: Mw=18,000; Mn=8,900. The $^1$H NMR spectrum (DMSO-d$_6$) of the polymer exhibits a broad resonance at about 5.7 ppm consistent with cyclopentenyl end groups.

In view of the above results, Example 15 demonstrates that carrying out a polymerization reaction of α,α-bis(trifluoromethyl)bicyclo[2.2.1]hept-5-ene-2-ethanol in the presence of cyclopentene yields a homopolymer that contains a cyclopentene end group.

Example 16

Initially, a pressure reactor is equipped with a magnetic stir bar and de-oxygenated. To the reactor is added α,α-bis(trifluoromethyl)bicyclo[2.2.1]hept-5-ene-2-ethanol (5.00 g, 18.2 mmol) followed by sufficient anisole to yield a total of 12 mL of solution. The solution is sparged with nitrogen for 20 to 30 min. To this solution is added 0.36 μmol of Catalyst B (0.72 mL of a 0.0005 M solution in anisole) followed by 1.8 μmol of N,N-dimethylanilinium tetrakis(pentafluorophenyl)borate in about 1 mL of anisole. Then, the reactor is heated at 60° C. and pressurized with ethylene to 5 psig and then vented. This is repeated several times (e.g., between 3 and 7 times). Finally, the reaction mixture is left under 5 psig ethylene overnight (at least 12 hours) with stirring. Thereafter, the reaction mixture is poured into pentane. The precipitated polymer is filtered and dried in a vacuum oven. The yield is 0.7 g. The filtrate is allowed to evaporate over several days in a vacuum oven to give 2.0 g of polymer. Total conversion is 54%.

The polymer's molecular weight is determined by GPC methods in THF using poly(styrene) as a standard. The pentane insoluble fraction exhibits a Mw=6,300 and Mn=4,300. The pentane soluble fraction exhibits a Mw=2,160 and Mn=1,760. Both fractions exhibit resonances in the olefinic region of their $^1$H NMR spectra consistent with a vinyl end group attached to the polymer chain: Δ 5.86 (br s, 1 H), 5.00 (br s, 2 H). The MALDI-TOF MS (matrix assisted laser desorption time-of-flight mass spectrometry, Bruker Reflex III instrument, reflectron and linear mode, negative ion spectra) of both fractions are consistent with the presence of vinyl-terminated polymer.

In view of the above results, Example 16 demonstrates that conducting a polymerization reaction of α,α-bis (trifluoromethyl)bicyclo[2.2.1]hept-5-ene-2-ethanol under ethylene pressure yields a low molecular weight homopolymer that is vinyl-terminated.

Examples 17a to 17e

Approximately 10 g of α,α-bis(trifluoromethyl)bicyclo [2.2.1]hept-5-ene-2-ethanol is weighed and placed into a glass vial equipped with a stir bar. The appropriate amount of ($\eta^6$-toluene)Ni($C_6F_5$)$_2$ is mixed with the above monomer in 40 mL of a 75:25 mixture of toluene:ethylacetate. See Table 4 below for the mole ratio of monomer to nickel catalyst for each of Examples 17a to 17e.

The polymerization of each example is run at room temperature (approximately 25° C.) for 16 hours. The polymer produced thereby is then precipitated into heptane, filtered and dried. The polymer is then dissolved in 100 g of MeOH and shaken with 25 g of Amberlite IRC-718 ion-exchange resin beads for 5 hours. Each sample is then individually filtered and the filtrate shaken with 25 g of fresh Amberlite IRC-718 ion-exchange resin beads. Then, each sample is filtered and the filtrate is added dropwise to water. The precipitated polymer from each example is filtered and dried at 45° C. See Table 4 below for details and results of Examples 17a to 17e.

TABLE 4

Polymerization of α,α-bis(trifluoromethyl)bicyclo[2.2.1] hept-5-ene-2-ethanol

| Example | Monomer to Catalyst Mole Ratio | Conversion Percentage | Mw | Mn | Mw/Mn |
|---|---|---|---|---|---|
| 17a | 5:1 | 56 | 23,900 | 6,820 | 3.51 |
| 17b | 6.7:1 | 64 | 27,900 | 11,200 | 2.49 |
| 17c | 10:1 | 70 | 28,100 | 13,000 | 2.16 |
| 17d | 30:1 | 63 | 39,800 | 20,900 | 1.90 |
| 17e | 40:1 | 72 | 45,300 | 25,200 | 1.80 |

In view of the results obtained from Examples 17a to 17e, these examples demonstrate that the ratio of monomer to nickel catalyst controls the molecular weight of α,α-bis (trifluoromethyl)bicyclo[2.2.1]hept-5-ene-2-ethanol homopolymers made using ($\eta^6$-toluene)Ni($C_6F_5$)$_2$.

Optical Density Determination of Various Polymers:

The optical density (OD) of the polymers according to the present invention are determined by the following method. A 15 weight percent solution of the desired polymer is formed using propylene glycol methylether acetate (PGMEA). The solution is dispensed onto a 1 inch quartz wafer and spun at 500 rpm for 15 sec and 2000 rpm for 60 sec. The wafers are then baked for 60 sec at 110° C.

The optical absorbance is measured at 193 nm using a Cary 400 Scan UV-Vis spectrophotometer. The thickness of the films are then measured using a TENCOR Profilometer after the films are scored. Optical density of the film is then calculated by dividing the absorbance by the thickness (in microns).

Figure 3:
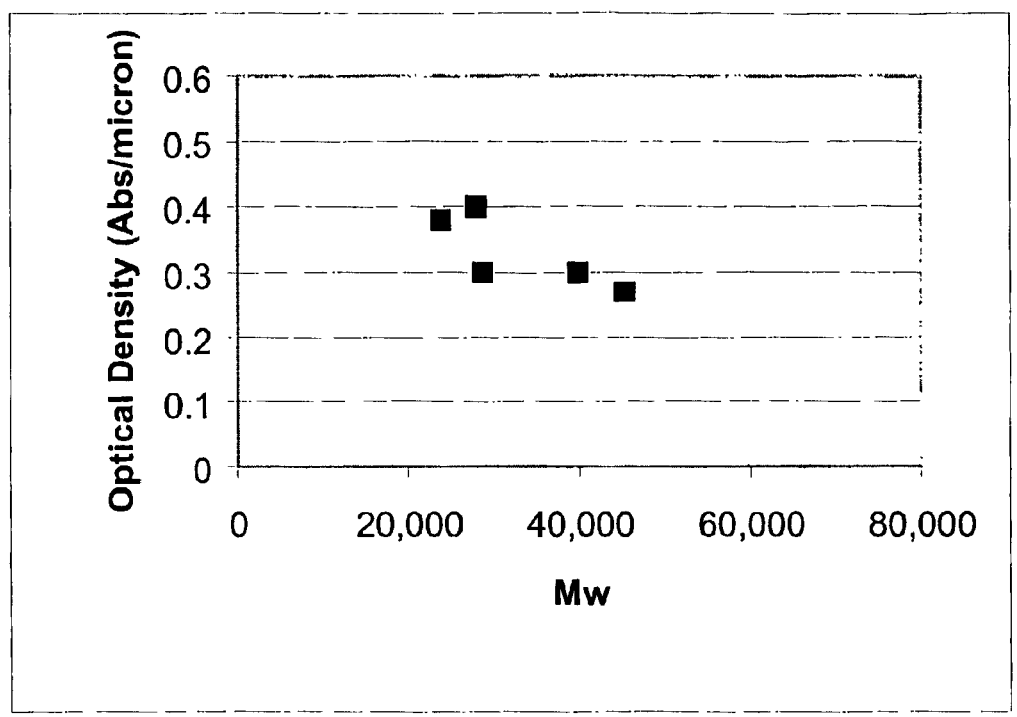
FIG. 3 is a plot of optical density (OD) versus Mw for homopolymers of α,α-bis(trifluoromethyl)bicyclo[2.2.1]hept-5-ene-2-ethanol made using a nickel catalyst.
Figure 4:
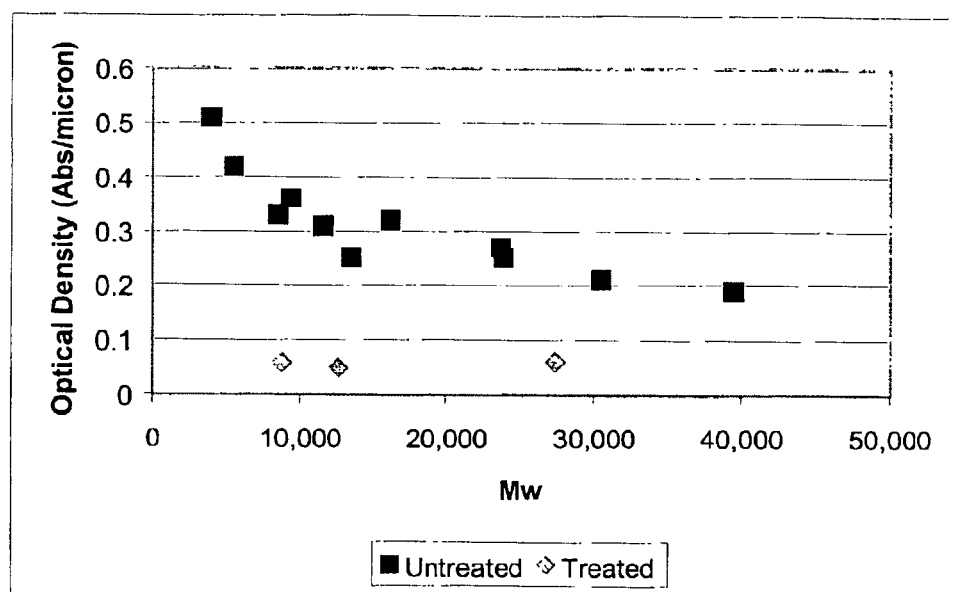
FIG. 4 is a graph which depicts the effect of post-treatment with acetic acid and hydrogen peroxide on the optical density (OD) for various α,α-bis(trifluoromethyl)bicyclo[2.2.1]hept-5-ene-2-ethanol.

The optical density for many different polymers containing α,α-bis(trifluoromethyl)bicyclo[2.2.1]hept-5-ene-2-ethanol is determined as a function of molecular weight (Mw). FIG. 3 shows a plot of optical density (OD) (absorbance/micron) versus the Mw of homopolymers made with palladium bis(tricyclophosphine) di(acetate) and N,N-dimethylanilinium tetrakis(pentafluorophenyl)borate. FIG. 4 shows a plot of optical density (OD) (absorbance/micron) versus the Mw of homopolymers made with ($\eta^6$-toluene)Ni ($C_6F_5$)$_2$ as a function of Mw. In both cases the optical density increases as the Mw decreases.

Example 18 (Includes Post-Treatment)

Initially, α,α-bis(trifluoromethyl)bicyclo[2.2.1]hept-5-ene-2-ethanol (160 g, 584 mmol) and 1-hexene (49.1 g, 585 mmol, 50 mole percent based on the moles of monomer) are weighed and combined in a glass vial. This is followed by the addition of 0.0092 g of palladium bis (tricyclohexylphosphine) di(acetate) (0.012 mmol, Catalyst B) and 0.047 g N,N-dimethylanilinium tetrakis (pentafluorophenyl)borate (0.058 mmol). This mixture is diluted with sufficient anisole to yield a 2.5 M solution of monomer. Then, this mixture is heated at 120° C. for 66 hours. Thereafter, the polymer is precipitated by pouring the reaction mixture into hexane. The precipitated polymer is filtered and dried at 75° C. in a vacuum oven. Next, the polymer is re-dissolved in 200 mL of toluene. This solution is added to hexane to precipitate the polymer. The solid is filtered and dried in a vacuum oven at 75° C. The polymer is again re-dissolved in 200 mL of methanol and heated at 60° C. for 12 hours. The solution is sequentially filtered through 5 micron, 1 micron, 0.45 micron, 0.22 micron, and 0.1 micron filters and then the polymer is precipitated into water, filtered, and dried in a vacuum oven at 100° C. The isolated yield is 106 g (66%). The polymer's molecular weight is determined by GPC methods in THF using poly (styrene) as a standard: Mw=28,300; Mn=11,300. The $^1$H NMR (CDCl$_3$/DMSO-d$_6$) spectrum of the polymer exhibits resonances between about 5.3 and 4.9 ppm consistent with olefinic end groups.

Thereafter, a portion of the above polymer is reacted with acetic acid and hydrogen peroxide to form epoxide and ring-opened epoxide end groups. Specifically, approximately 94 g of the above polymer is dissolved in 310 g of toluene. To this solution about 250 mL of glacial acetic acid and 125 mL of 15% hydrogen peroxide is added. This mixture is heated at 90° C. for 1.5 hours. Then the mixture is allowed to cool to room temperature. The top, organic phase is separated from the aqueous phase and washed with deionized water to remove any residual acid.

Then the polymer is precipitated from the organic layer using heptane. The precipitated polymer is filtered and dried at 65° C. under vacuum. 75.7 g of polymer is isolated.

The $^1$H NMR (CDCl$_3$/DMSO-d$_6$) spectrum of the polymer exhibits no resonances between about 5.3 and 4.9 ppm consistent with the absence of olefinic groups.

The lower molecular weight portion of this polymer is fractionated by preparative SEC and is analyzed by MALDI-TOF MS (matrix assisted laser desorption time-of-flight mass spectrometry, Bruker Reflex III instrument, reflectron and linear mode, positive ion spectra). Interpretation of these results are consistent with the formation of a polymer with an epoxidized hexenyl end groups as the major component and polymers with an end group derived from a ring-opening reaction of the epoxide end group with acetic acid to form a vicinal acetate alcohol functionality as a minor component. The same fractions are analyzed by negative ion MALDI-TOF MS. The spectra obtained from this experiment are also in good agreement with the presence of the epoxidized hexenyl end groups on the polymer chains.

In view of the above Example 18 demonstrates that the homopolymer of bis(trifluoromethyl)bicyclo[2.2.1]hept-5-ene-2-ethanol made using a palladium catalyst and 1-hexene as a chain transfer agent contains hexenyl end groups that can be reacted with acetic acid and hydrogen peroxide to form epoxide and ring-opened epoxide end groups.

Example 19 (Post Treatment of Polymer of Example 15)

Approximately 0.6 g of vinyl-terminated homopolymer of α,α-bis(trifluoromethyl)bicyclo[2.2.1]hept-5-ene-2-ethanol is dissolved in 1.8 g of toluene. To this solution is added 1 mL of glacial acetic acid and 1 mL of 15% hydrogen peroxide. This mixture is heated at 80° C. for 1 hour. The aqueous and organic layers are permitted to separate and then the aqueous layer is removed. The organic layer is washed three times with 2 mL of de-ionized water. After each wash, the aqueous layer is removed. The resulting the organic phase is then poured into heptane (about 20 mL) and the resulting polymer is filtered and dried in a vacuum oven at 65° C. $^1$H NMR analysis of the polymer shows that the intensity of the vinyl resonances are substantially reduced. The MALDI-TOF MS (negative ion spectra) of the polymer is consistent with formation of the epoxidized, vinyl-terminated homopolymer of α,α-bis(trifluoromethyl) bicyclo[2.2.1]hept-5-ene-2-ethanol.

In view of the above results, Example 19 demonstrates that post-treatment of a vinyl-terminated homopolymer of α,α-bis(trifluoromethyl)bicyclo[2.2.1]hept-5-ene-2-ethanol made using palladium bis(tricyclophosphine) di(acetate) and N,N-dimethylanilinium tetrakis(pentafluorophenyl)borate with ethylene as a chain transfer agent with a mixture of acetic acid and hydrogen peroxide results in the formation of an epoxy-terminated homopolymer.

Example 20 (Post Treatment Example)

93 g of α,α-bis(trifluoromethyl)bicyclo[2.2.1]hept-5-ene-2-ethanol homopolymer (made in accordance with the process discussed above in any one of Examples 1 to 6) containing 1.4 ppm Pd is dissolved in 309 g of toluene. To this solution is added 250 mL of glacial acetic acid and 125 mL of 15% hydrogen peroxide. This mixture is then heated at 90° C. for an hour. The mixture is then permitted to cool to room temperature. The top, organic phase is separated from the aqueous phase and washed with deionized water to remove any residual acid. Then the polymer is precipitated from the organic layer using heptane. Thereafter, the precipitated polymer is filtered and dried at 65° C. under vacuum. 75.7 g of polymer is isolated. The level of Pd in the treated polymer is determined to be less than 0.20 ppm which is the detection limit of analytical method used. The palladium level is detected using inductively coupled plasma-optical emission spectroscopy after the polymer samples are digested in a closed vessel microwave system with reverse aqua regia.

Figure 5:
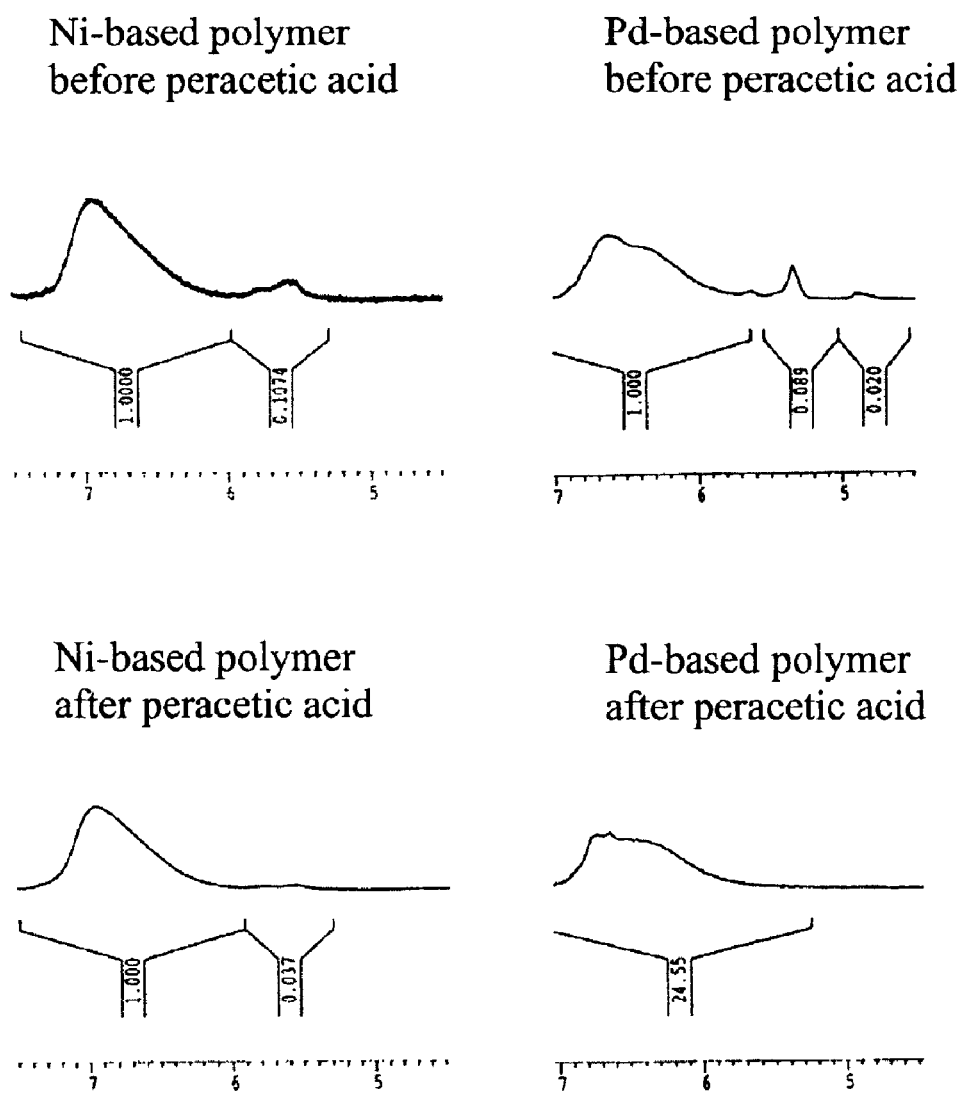
FIG. 5 are $^1$H NMR spectra of Ni and Pd-based α,α-bis(trifluoromethyl)bicyclo[2.2.1]hept-5-ene-2-ethanol homopolymers before and after peracetic acid treatment.

FIG. 5 shows the that the OD of a series of homopolymers of α,α-bis(trifluoromethyl)bicyclo[2.2.1]hept-5-ene-2-ethanol that have been treated with acetic acid and hydrogen peroxide according to the above procedure have a substantially lower OD than the those homopolymers that have not been subjected to such a post-treatment process. Additionally, FIG. 5 shows that unexpectedly even polymers with a low molecular weight yield a low optical density after being post-treated in accordance with the process of Example 20.

Post-treatment in accordance with the process of Example 20 or the other post-treatment examples of a polymer composition made in accordance with the present invention also reduces the residual amount of catalyst (including metal) present in the polymer product.

Example 21 (Saturation of End Group Using Hydrogenation)

Approximately 3 g of a α,α-bis(trifluoromethyl)bicyclo[2.2.1]hept-5-ene-2-ethanol homopolymer made using a Pd catalyst in the presence of 1-hexene as a chain transfer agent is dissolved in methylene chloride along with 0.0097 g of (tricyclohexylphosphine)(1,5-cyclooctadiene)(pyridine)iridium(I) hexafluorophosphate and placed under 90 psig hydrogen. After 5 days, 0.0084 g of additional iridium complex is added and the reaction mixture is placed under 90 psig hydrogen for one more day. Then 0.0078 g of additional iridium complex is added and the mixture is stirred under 90 psig hydrogen for 5 more days. The reaction solvent is removed on a rotoevaporator. The remaining solid is dissolved in methanol and then precipitated into water. The polymer is collected by filtration and dried in a vacuum oven overnight. The yield is 2.2 g. The polymer's molecular weight is determined by GPC methods in THF using poly(styrene) as a standard: Mw=10,800; Mn=4,740. Analysis of the $^1$H NMR spectrum of the polymer before and after hydrogenation shows that the olefinic end groups are 75% hydrogenated after being treated in accordance with the above method. The optical density of the polymer at 193 nm after treatment in accordance with this example is determined to be 0.23 absorbance units/micron. This represents more than a 33% decrease in optical density compared to an unhydrogenated polymer of the same molecular weight (the optical density of the unhydrogenated polymer of the same molecular weight was 0.31).

Example 21 demonstrates that hydrogenation of an olefinic end group appended to a homopolymer of α,α-bis(trifluoromethyl)bicyclo[2.2.1]hept-5-ene-2-ethanol made using a Pd catalyst in the presence of 1-hexene as a chain transfer agent resulted in a polymer with a lower optical density at 193 nm.

Example 22

A homopolymer of α,α-bis(trifluoromethyl)bicyclo[2.2.1]hept-5-ene-2-ethanol made using palladium bis(tricyclophosphine) di(acetate), Catalyst B, and N,N-dimethylanilinium tetrakis(pentafluorophenyl)borate (e.g., a homopolymer made in accordance with Examples 1 to 6 above) is dissolved in CDCl$_3$ and DMSO-d$_6$. The $^1$H NMR spectrum was recorded on a Bruker 500 MHz instrument.

The same process is repeated for a polymer made using (η$^6$-toluene)Ni(C$_6$F$_5$)$_2$ (e.g., a homopolymer made in accordance with Examples 17a to 17e).

FIG. 6 depicts the $^1$H NMR spectral region from about 4.5 to 7.0 ppm. The large, broad resonance above 6 ppm is assigned to the hydroxylic proton of the —CH$_2$C(CF$_3$)$_2$OH pendant group on α,α-bis(trifluoromethyl)bicyclo[2.2.1]hept-5-ene-2-ethanol. The smaller broad resonances between about 4.6 and 6 ppm are assigned to olefinic end groups of the polymer. Note that after peracetic acid treatment, these olefinic end group resonances are substantially reduced in both polymers made using a palladium and nickel catalyst. This is consistent with transformation of such end groups into saturated epoxides or vicinal acetate alcohol end groups.

Thus, Example 22 demonstrates that the post-treatment of a polycyclic polymer made using both a palladium catalyst or a nickel catalyst results in a substantial reduction in the presence of olefinic end groups on the polymer.

Example 23

Initially, α,α-bis(trifluoromethyl)bicyclo[2.2.1]hept-5-ene-2-ethanol (26.9 g, 98.2 mmol), a t-butylester of 5-norbornene carboxylic acid (8.16 g, 42.1 mmol) and 1-hexene (21.9 g, 261 mmol, 65 mole percent based on the moles of monomer), and lithium tetrakis(pentafluorophenyl)borate.2.5 etherate (0.122 g, 0.140 mmol) are weighed and combined in a glass vial. The volume of the mixture is brought up to 70 mL by the addition of anisole. A stock solution of 0.0314 g of palladium bis(tricyclohexylphosphine) di(acetate) (0.0400 mmol, Catalyst B) in 4 mL of anisole is then prepared. A 2.8 mL aliquot from this solution is added to the above monomer and 1-hexene mixture. This mixture is then heated at 95° C. for 32 hours. Thereafter, the reaction mixture is cooled and diluted with 20 mL of toluene. The polymer is then precipitated by pouring the reaction mixture into heptane (~1000 mL). The precipitated polymer is filtered and dried. The conversion yields 23.6 g (67%).

Next, the polymer is dissolved in 140 mL of toluene and 5 mL of THF. To this solution is added 50 mL of acetic acid, 25 mL of hydrogen peroxide (30% in water), and 25 mL of deionized water. The mixture is stirred for 1 hour at about 85° C. The mixture is cooled and the organic layer is separated and washed four times with deionized water. The polymer is precipitated into heptane.

The polymer's molecular weight is determined by GPC methods in THF using poly(styrene) as a standard: Mw=9,750, Mn=5,150, Mw/Mn=1.89. $^{13}$C NMR analysis in DMSO-$d_6$ shows that the copolymer consists of 60% α,α-bis(trifluoromethyl)bicyclo[2.2.1]hept-5-ene-2-ethanol and 40% t-butylester of 5-norbornene carboxylic acid. There is no evidence of deprotection of the acid labile monomer.

Thus, the process of Example 23 demonstrates that the methods of polymerization in accordance with the present invention and the post-polymerization peracetic acid treatment do not result in a substantial deprotection of the acid labile pendant group.

Example 24

Initially, α,α-bis(trifluoromethyl)bicyclo[2.2.1]hept-5-ene-2-ethanol (121.2 g, 0.442 mol), t-butylester of 5-norbornene carboxylic acid (28.6 g, 0.147 mol) and 1-hexene (29.7 g, 0.354 mol, 38 mol percent on monomer), and lithium tetrakis(pentafluorophenyl)borate.2.5 etherate (12 mL of a 0.05 M solution in anisole, 0.0006 mol) are weighed and combined in a glass vial. Next, anisole (390 mL) is added to the reaction mixture. A palladium bis(tricyclohexyl-phosphine) di(acetate) solution (15 mL of a 0.0092 M solution in anisole, Catalyst B) is added to the reaction mixture. This mixture is then heated at 95° C. for 20 hours. The reaction mixture is cooled and then poured dropwise into a four-fold volume excess of heptane. The precipitate is then filtered and dried under vacuum at 45° C. The yield is 72.3 g (48%).

The polymer is then dissolved in MeOH and heated at 60° C. overnight. Next, the solution is cooled and then sequentially passed through a 0.45, then a 0.22, and then a 0.1 micron filter. The polymer is precipitated by addition to water. The polymer is filtered and dried under vacuum at 60° C. overnight.

Approximately 20 g of the polymer is dissolved in toluene (140 g). To this solution is added glacial acetic acid (50 g) and hydrogen peroxide (25 g, 30 weight percent) diluted in water (25 g). The two phase mixture is stirred and heated at 85° C. for one hour. The mixture is cooled and the organic layer is separated and washed three times with water. The organic layer is poured dropwise into heptane to precipitate the polymer. The polymer is filtered and dried under vacuum.

The polymer's molecular weight is determined by GPC methods in THF using poly(styrene) as a standard: Mw=30,200, Mn=15,100, Mw/Mn=2.00. $^{13}$C NMR analysis in DMSO-$d_6$ shows that the copolymer consisted of 62% α,α-bis(trifluoromethyl)bicyclo[2.2.1]hept-5-ene-2-ethanol and 38% t-butylester of 5-norbornene carboxylic acid. There is no evidence of deprotection of the acid labile monomer.

Prior to peracetic acid treatment, it is determined that the polymer contains 161 ppm palladium and the optical density at 193 nm is 0.27 absorption units/micron. After peracetic acid treatment, the polymer contains 27 ppm palladium and the optical density at 193 nm is 0.12 absorption units/micron. The level of palladium in the polymer is determined using the method discussed above in Example 20.

FIG. 6 confirms that the peracetic acid treatment of copolymers of α,α-bis(trifluoromethyl)bicyclo[2.2.1]hept-5-ene-2-ethanol and t-butylester of 5-norbornene carboxylic acid (approximately 70:30 molar composition, respectively) lowers the optical density across a broad molecular weight range at 193 nm. Thus, the catalyst system of the present invention and the post-polymerization peracetic acid treatment of the present invention do not substantially result in deprotection of any acid labile pendant group which may be present in a polymer made in accordance with the present invention. Example 24 also shows that peracetic acid treatment results in lower residual palladium and lower optical density at 193 nm.

Example 25

Initially, α,α-bis(trifluoromethyl)bicyclo[2.2.1]hept-5-ene-2-ethanol (13.6 g, 50 mmol) and t-butylester of 5-norbornene carboxylic acid (9.7 g, 50 mmol, 20 mol percent on monomer) are weighed and combined in a glass vial. To this solution is added 96 mL of toluene. A solution of 0.97 g of (η$^6$-toluene)Ni($C_6F_5$)$_2$ in 8.73 g of toluene is added to the above mixture. This mixture is then stirred at room temperature for 4 hours. The residual monomer present in the untreated polymer produced by the above reaction is determined by gas chromatography and the nickel level is determined by inductively coupled plasma-optical emission spectroscopy (ICP-OES).

A portion of the polymer solution (10 g) is then treated with 15 g of IRC-718 ion exchange resin by stirring the solution for 24 hours. The solution is filtered and the filtrate treated with 5 g Amberlyst 15 ion exchange resin by stirring the solution 18 hours. The ion exchange resin is removed by filtration. Then the polymer is precipitated by pouring the reaction mixture into heptane. The precipitated polymer is filtered and dried at 65° C. in a vacuum oven overnight. The optical density of the ion exchanged and precipitated polymer is determined as follows. A 20 weight percent solution of the polymer in propylene glycol methylether acetate (PGMEA) is dispensed onto a 1 inch quartz wafer through a 0.2 micron Teflon syringe filter and spun at 500 rpm for 10 sec and 2000 rpm for 60 sec. The wafers are then baked for 60 sec at 130° C.

The optical absorbance is measured at 193 nm using a Cary 400 Scan UV-Vis spectrophotometer. The thickness of the films are measured using a TENCOR Profilometer after the films are scored. The optical density of the film is then calculated by dividing the absorbance by the thickness (in microns).

The rest of the untreated polymer is treated as follows. To approximately 50 g of polymer solution, approximately 25 g of glacial acetic acid and 25 g of 30% hydrogen peroxide are added thereto. This mixture is heated at 90° C. for 2 hours. Then the mixture is allowed to cool to room temperature. The top, organic phase is separated from the aqueous phase. This extraction procedure is repeated with 25 g glacial acetic acid, 25 g deionized water and 12.5 g tetrahydrofuran at 60° C. for 1 hour, and then with water to remove any residual acid. The residual monomer in the peracetic acid treated polymer is measured by GC. The polymer is precipitated by pouring the reaction mixture into methanol. Thereafter, the precipitated polymer is filtered and dried at 70° C. in a vacuum oven. The optical density of the peracetic acid-treated and precipitated polymer is measured as described above. The residual nickel in the peracetic acid-treated and precipitated polymer is measured via ICP-OES. See Table 5 below for the results.

As can be seen from Table 5, the data shows that preacetic acid treated polymer contains a significantly lower concentration of residual monomer, a lower concentration of residual nickel, and exhibits a lower optical density at 193 nm.

Additionally the data shows that the treatment with peracetic acid does not deprotect the acid labile group. The composition of both the ion exchange resin-treated and the peracetic acid-treated polymers are essentially identical as determined by $^{13}$C NMR. The ion exchange resin-treated polymer contains 43 mole percent α,α-bis(trifluoromethyl) bicyclo[2.2.1]hept-5-ene-2-ethanol and 57 mole percent t-butylester of 5-norbornene carboxylic acid. The peracetic acid-treated polymer contains 45 mole percent α,α-bis (trifluoromethyl)-bicyclo[2.2.1]hept-5-ene-2-ethanol and 55 mole percent t-butylester of 5-norbornene carboxylic acid.

In view of the above data, this example demonstrates that peracetic acid treatment results in substantial reduction in optical density, residual metals and residual monomer.

Example 26

Initially, α,α-bis(trifluoromethyl)bicyclo[2.2.1]hept-5-ene-2-ethanol (1.37 g, 5.0 mmol) and 0.04 g of cyclopentene (0.56 mol) are weighed and combined in a glass vial along with enough anisole to make a 1.5 M solution of monomer. In a separate vial are combined 100 μL of an anisole solution (4 mL) containing 0.0022 g of allylpalladium (trinaphthylphosphine) triflate and 100 μL of an anisole solution (4 mL) containing 0.0174 g of lithium tetrakis (pentafluorophenyl)borate.2.5 etherate. This mixture is added to the monomer solution and heated at 80° C. for 18 hours. The solution is poured into heptane to precipitate the polymer which is then filtered and dried under vacuum at 70° C. The yield is 0.67 g (49% conversion). The polymer's molecular weight is determined by GPC methods in THF using poly(styrene) as a standard: Mw=90,600, Mn=38,000, Mw/Mn=2.38.

This example yields a homopolymer of α,α-bis (trifluoromethyl)bicyclo[2.2.1]hept-5-ene-2-ethanol with a narrow polydispersity.

Example 27

Initially, α,α-bis(trifluoromethyl)bicyclo[2.2.1]hept-5-ene-2-ethanol (1.37 g, 5.0 mmol) and 0.15 g of cyclopentene (2.1 mol) are weighed and combined in a glass vial along with enough anisole to make a 1.5 M solution of monomer. In separate vials are prepared 100 μL of an anisole solution (2 mL) containing 0.0017 g of Catalyst E and 100 μL of an anisole solution (2 mL) containing 0.0080 g of N,N-dimethylanilinium tetrakis(pentafluorophenyl)borate. These mixtures are added to the monomer solution and heated at 80° C. for 18 hours. The resulting solution is poured into 300 mL of heptane to precipitate the polymer which is then filtered and dried under vacuum at 70° C. The yield is 0.60 g (44%).

The polymer's molecular weight is determined by GPC methods in THF using poly(styrene) as a standard: Mw=108, 000 Mn=45,800 Mw/Mn=2.35.

This example shows that the homopolymerization of α,α-bis(trifluoromethyl)bicyclo[2.2.1]hept-5-ene-2-ethanol using Catalyst E yields a polymer with monomodal polydispersity.

Example 28

Initially, α,α-bis(trifluoromethyl)bicyclo[2.2.1]hept-5-ene-2-ethanol (1.37 g, 5.0 mmol) and 0.15 g of cyclopentene

TABLE 5

| Treatment | Residual Monomer (wt % on a solid polymer basis) | Residual Nickel (ppm on a solid polymer basis) | Optical Density at 193 nm (abs/micron) | Mw | Mn | Composition ($^{13}$CNMR) |
|---|---|---|---|---|---|---|
| Untreated | 14.1 | 5,030 | — | — | — | — |
| Ion Exchange and Precipitated | — | 38 | 0.227 | 29,700 | 17,900 | 43:57 |
| Peracetic Acid Treated | less than 0.01 | — | — | — | — | — |
| Peracetic Acid Treated and Precipitated | — | less than 1 | 0.192 | 30,000 | 18,900 | 45:55 |

(2.1 mol) are weighed and combined along with enough anisole to make a 1.5 M solution of monomer. In separate vials are prepared 100 μL of an anisole solution (2 mL) containing 0.0015 g of Catalyst F and 100 μL of an anisole solution (2 mL) containing 0.0080 g of N,N-dimethylanilinium tetrakis(pentafluorophenyl)borate. These mixtures are added to the monomer solution and heated at 80° C. for 18 hours. The resulting solution is poured into 300 mL of heptane to precipitate the polymer which is then filtered and dried under vacuum at 70° C. The yield is 1.01 g (74%).

The polymer's molecular weight is determined by GPC methods in THF using poly(styrene) as a standard: Mw=53,400 Mn=20,300 Mw/Mn=2.63.

In general, the catalyst systems of the present invention permit the polymerization of one or more of the above monomers at relatively low catalyst concentrations, while permitting a relatively high degree of molecular weight control.

Additionally, due to the reduced optical absorbance at 157 nm and 193 nm by the fluorinated polycyclic polymers made in accordance with the present invention, these polymers offer ideal compositions for use as photoresists in a 193 nm or 157 nm deep UV lithography process. While not wishing to be bound to any one theory, fluorinated polymers are believed to be ideally suited for such lithography processes due to the reduced optical absorbance.

Example 29

The vinyl terminated homopolymer of α,α-bis(trifluoromethyl)bicyclo[2.2.1]hept-5-ene-2-ethanol (1.50 g, 0.49 mmol), [(tricyclohexylphosphine)(1,5-cyclooctadiene)(pyridine)Iridium]$PF_6$ (21 mg, 0.026 mmol), and toluene (35 ml) are combined in a Buchi pressure reactor and stirred until dissolved. The reactor is sealed, charged with $H_2$ gas (85 psi) and heated to 65° C. for 15 h. The reactor contents are then filtered though Whattman 42 filter paper and the solvent is evaporated under reduced pressure. The resulting yellow material is dissolved in acetone (25 ml) along with $H_2O_2$ (ca. 0.25 ml, 30% w/w). The solution is heated to 56° C. for 30 min and filtered to remove solids. Smopex® 110 a fibrous ion exchange medium (Johnson Matthey) (10 mg) is added and the solution is stirred for 30 min. After filtering through a 0.20 μm PTFE filter disk (Osmonics), the acetone is evaporated under reduced pressure to afford a colorless white solid. The material is dissolved in toluene (30 ml), washed with $H_2O$ (3×20 ml), and precipitated by dropwise addition to heptane (150 ml). The product is isolated by filtration and dried in vacuo (70° C., 12 h) to afford a white amorphous solid (1.1 g, 73%).

Example 30

The vinyl terminated homopolymer of α,αbis(trifluoromethyl)bicyclo[2.2.1]hept-5-ene-2-ethanol (1.5 g, 0.49 mmol), $Et_3SiH$ (0.31 ml, 2.0 mmol), $H_2PtCl_6.6H_2O$ (10 mg, 0.024 mmol), and toluene (35 ml) are combined in a 100 ml serum cap vial. The vial is sealed, and heated to 65° C. for 10 h. The reddish black solution is filtered through a 0.20 μm PTFE filter disk (Osmonics) and the solvent is evaporated under reduced pressure. The beige product is dissolved in acetone (30 ml) along with $H_2O_2$ (ca. 0.25 ml, 30% w/w) and the solution is heated to 56° C. for 30 min. After filtering though Whattman 42 filter paper to remove solids, Smopex® 110 (Johnson Matthey) (10 mg) is added and the solution is stirred for 30 min. The mixture is filtered through a 0.20 μm PTFE filter disk (Osmonics) and the acetone is evaporated under reduced pressure to afford a colorless white solid. The resulting material is dissolved in toluene (30 ml), washed with $H_2O$ (3×20 ml), and precipitated by dropwise addition to heptane (150 ml). The product is isolated by filtration and dried in vacuo (70° C., 12 h) to afford a white amorphous solid (1.3 g, 87%).

Example 31

The 80:20 vinyl terminatedcopolymer of α,α-bis(trifluoromethyl)bicyclo[2.2.1]hept-5-ene-2-ethanol and t-butylester of 5-norbornene carboxylic acid (1.5 g, 0.19 mmol), [(tricyclohexylphosphine)(1,5-cyclooctadiene)(pyridine)iridium]$PF_6$ (31 mg, 0.039 mmol), and toluene (35 ml) are combined in a Buchi pressure reactor and stirred until dissolved. The reactor is sealed, charged with $H_2$ gas (85 psi) and heated to 65° C. for 15 h. The solvent is evaporated under reduced pressure and the resulting yellow material was dissolved in acetone (25 ml) along with $H_2O_2$ (ca. 0.25 ml, 30% w/w). After heating to 56° C. for 30 min, the solution is filtered though Whattman 42 filter paper to remove solids. Smopex® 110 (Johnson Matthey) (10 mg) was added and the solution is stirred for 30 min. The mixture was filtered through a 0.20 μm PTFE filter disk (Osmonics) and the solvent is evaporated under reduced pressure to afford a colorless white solid. The resulting solid is redissolved in toluene (30 ml), washed with $H_2O$ (3×20 ml), and precipitated by dropwise addition to heptane (150 ml). The product is isolated by filtration and dried in vacuo (70° C., 12 h) to afford a white amorphous solid (0.97 g, 64%).

Example 32

The 80:20 vinyl terminated copolymer of α,α-bis(trifluoromethyl)bicyclo[2.2.1]hept-5-ene-2-ethanol and t-butylester of 5-norbornene carboxylic acid (1.4 g, 0.18 mmol), $Et_3SiH$ (0.12 ml, 0.73 mmol), $H_2PtCl_6.6H_2O$ (10 mg, 0.024 mmol), and toluene (35 ml) are combined in a 100 ml serum cap vial. The vial is sealed, and heated to 65° C. for 10 h. The yellow solution is reddish-black. After filtering though Whattman 42 filter paper, the solvent is evaporated under reduced pressure. The resulting beige product is dissolved in acetone (30 ml) along with $H_2O_2$ (ca. 0.25 ml, 30% w/w) and the solution is heated to 56° C. for 30 min. After filtering though Whattman 42 filter paper to remove solids, Smopex® 110 (Johnson Matthey) (10 mg) is added and the solution was stirred for 30 min. The mixture is filtered through a 0.20 μm PTFE filter disk (Osmonics) and the acetone is removed under reduced pressure to afford a colorless white solid. The resulting material is dissolved in toluene (30 ml), washed with $H_2O$ (3×20 ml), and precipitated by dropwise addition to heptane (150 ml). The product is isolated by filtration and dried in vacuo (70° C., 12 h) to afford a white amorphous solid (1.32 g, 88%).

TABLE 6

| Example | Modification | Conversion Percentage[a] | Mw before treatment[b] | Mw after treatment[b] | OD before treatment[c] | OD after treatment[c] |
|---|---|---|---|---|---|---|
| 29 | hydrogenation | >97 | 3076 | 4006 | 0.45 | 0.07 |
| 30 | hydrosilation | 67 | 3076 | 3778 | 0.45 | 0.22 |
| 31 | hydrogenation | >97 | 7655 | 7742 | 0.35 | 0.11 |
| 32 | hydrosilation | 63 | 7655 | 8047 | 0.35 | 0.27 |

[a]The conversions (%) were obtained by integration of the polymer $^1$H NMR spectra (Δ4.5–6.0 ppm) before and after post-treatment conversion and represent consumption of the unsaturation at the polymer terminus by hydrogen or the hydrosilane.
[b]Molecular weights were obtained by GPC.
[c]Optical density (OD) measured at 193 nm (Absorbance/micron).

Post Treatment:

As can be seen from the Examples above, the present invention is also concerned with methods by which to post treat the reaction mixtures generated by the polymerization reactions disclosed herein. Such post-treatment offers numerous advantages such as a reduction in the optical density of the polymer product; a reduction in the amount of residual metal and/or catalyst present in the polymer product; and such treatment does not generally de-protect any acid labile pendant group which may optionally be present in the polymer product.

For example, the molecular weight of a homo- or co-polymer produced in accordance with the present invention can be further controlled by the use of a linear or branched $C_2$ to $C_{20}$ olefin compound (e.g., 1-hexene). The use of such compounds to control the molecular weight of the polymers produced in accordance with the present invention is also advantageous in that above-mentioned olefin compounds reduce the amount of acid labile groups, if present, clipped from the monomer during polymerization.

As discussed above, the present invention also provides methods by which to reduce the optical density of an olefinic-end group containing fluorinated polymer made in accordance with the present invention. For example, post polymerization reactions which can be used to reduce the optical density of such fluorinated polymers made in accordance with the present invention include, but are not limited to, epoxidation, hydrogenation, hydroformylation, hydrosilation, cyclopropanation (both to form hydrocarbon cyclopropanyl and fluorinated cyclopropanyl groups).

The polymer compositions produced in accordance with the present invention if subjected to a peracid post-treatment (e.g., persulfonic, perchromic, a peracetic acid, etc.) realize a reduction in one or more of: (1) the optical density of a polymer (in one case by the reduction of the amount of olefinic end groups, if present); (2) removal of residual catalyst and, if present, cocatalyst; and (3) removal of residual monomer (presumably by epoxidation and extraction). Surprisingly, the peracid post treatment of the polymer does not cleave the acid labile groups that are pendant from the polymer backbone.

Molecular Weight Control:

As noted above, the present invention also permits molecular weight control of the polymers produced in accordance with the present invention via the use of a CTA (e.g., 1-hexene or cyclopentene).

Removal of Metal and Monomer:

As is discussed above, the present invention via post-treatment with peracid permits the removal of residual metal as well as residual monomer.

Alternative Post-Treatments Aimed at Reducing the Optical Density of Polycyclic Polymers:

As is noted above, the present invention is not limited to only peracid treatment as a post polymerization treatment to lower the optical density of the polymer. Other post polymerization treatments that should be considered are any chemical reaction that transforms the olefinic end group into a less absorbing species at both 157 and 193 nm. Those reactions include, but are not limited to, epoxidation, hydrogenation, hydroformylation, hydrosilation, cyclopropanation (both to form hydrocarbon cyclopropanyl and fluorinated cyclopropanyl groups).

Fluorinated Acid Labile Monomers:

The use of acid labile monomers that are fluorinated may lower the optical density of the polymer products of the present invention even further.

Methods for utilizing photoresist compositions made in accordance with the present invention are well known in the art (see e.g., U.S. Pat. Nos. 6,136,499 and 6,232,417 which are hereby incorporated by reference for their disclosure regarding methods of using polymer photoresist compositions in lithography).

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described integers (components, assemblies, devices, compositions, etc.), the terms (including a reference to a "means") used to describe such integers are intended to correspond, unless otherwise indicated, to any integer which performs the specified function of the described integer (i.e., that is functionally equivalent), even though not structurally equivalent to the disclosed structure which performs the function in the herein illustrated exemplary embodiment or embodiments of the invention. In addition, while a particular feature of the invention may have been described above with respect to only one of several illustrated embodiments, such feature may be combined with one or more other features of the other embodiments, as may be desired and advantageous for any given or particular application.

What is claimed is:

1. A method for reducing the optical density of a polymer comprising polycyclic repeating units, at least one of such polycyclic repeating units containing an unsaturated terminal group, the method comprising:

providing a solution of such polymer;

incorporating a post-fuctionalization agent selected from hydrogen, a peracid, a hydrosilation agent, and a hydroformylation agent into such solution; and causing such post-fuctionlization agent to react with the unsaturated terminal group of the dissolved polymer.

2. The method according to claim 1 wherein said peracid is a mixture of glacial acetic acid and hydrogen peroxide.

3. A method for reducing the optical density, residual metal content and residual monomer content of an addition polymer comprising polycyclic repeating units containing pendant acid labile groups and terminal unsaturated end groups comprising:

a) reacting a mixture comprising said polymer and a solvent with peracid at elevated temperature for a period of time sufficient to epoxidize said unsaturated end groups; and b) separating said epoxidized polymer from said solvent.

4. The method of claim 3 wherein said peracid is a 1:1 mixture of glacial acetic acid and hydrogen peroxide.

5. The method of claim 3 wherein said mixture further comprises a fibrous ion exchange resin.

6. The method of claim 5 wherein said polymer comprises repeating units selected from one or more of the repeating units represented by the formula;

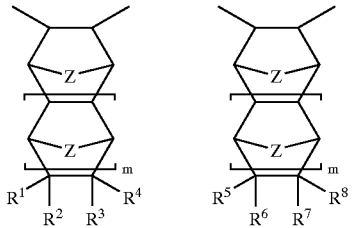

wherein $R^1$ to $R^4$ independently represent hydrogen linear or branched ($C_1$ to $C_{30}$) alkyl, linear and branched ($C_1$ to $C_{24}$) halohydrocarbyl, linear or branched ($C_2$ to $C_{30}$) olefin; —$(CH_2)_n$—$C(O)OR^*$, —$(CH_2)_n$—$C(O)OR$, —$(CH_2)_n$—$OC(O)R$, —$(CH_2)_n$—$C(O)R$, —$(CH_2)_n$—$OC(O)OR$, —$(CH_2)_n$—$C(R)_2$—$CH(R)(C(O)OR^{})$, —$(CH_2)_n$—$(CR_2)_n$—$CH(R)(C(O)OR^{})$, —$(CH_2)_n$—$C(OR^{*})$—$(CF_3)_2$, —$(CR'_2)_n$—O—R— and —$(CH_2)_n$—$C(R)_2$—$CH(C(O)OR^{})_2$; where R represents hydrogen, linear and branched ($C_1$ to $C_{10}$) alkyl; R' represents hydrogen or a halogen; R* represents an acid labile moiety; R** independently represents R or R*; R*** represents —$CH_2OR$, —$C(O)OR$ or —$C(O)R$; n is an integer from 0 to 10; m is an integer from 0 to 5; and Z represents —$(CH_2)_p$—, oxygen, sulfur, or —NH— and p is equal to 1 or 2; and wherein $R^5$ to $R^8$ independently represent hydrogen, linear or branched ($C_1$ to $C_{30}$) alkyl, linear or branched ($C_2$ to $C_{30}$) olefin; —$(CH_2)_n$—$C(O)OR^*$, —$(CH_2)_n$—$C(O)OR$, —$(CH_2)_n$—$OR$, —$(CH_2)_n$—$OC(O)R$, —$(CH_2)_n$—$C(O)R$, —$(CH_2)_n$—$OC(O)OR$, —$(CH_2)_n$—$C(R)_2$—$CH(R)(C(O)OR^{})$, —$(CH_2)_n$—$(CR_2)_n$—$CH(R)(C(O)OR^{})$, —$(CR'_2)_n$—O—R— and —$(CH_2)_n$—$C(R)_2$—$CH(C(O)OR^{})_2$; where R represents hydrogen, linear and branched ($C_1$ to $C_{10}$) alkyl, —$(CH_2)_s$— where s is an integer from 1 to 10; Z including p, R', R", R, n and m are as defined above, with the proviso, that one of $R^1$ to $R_8$ must represent arm acid labile moiety.

7. The polymer of claim 6 wherein Z is methylene.

8. The polymer of claim 7 wherein at least one of $R^1$ to $R^8$ is selected from the group represented by the formula —$(CH_2)_n$—$C(O)OR^*$.

9. The polymer of claim 8 wherein at least one of $R^1$ to $R^4$ is a halohydrocarbyl group represented by the formula $C_rX"_{2r+1}$ wherein X" is independently selected from fluorine, chlorine, bromine and iodine, and r is an integer from 1 to 20.

10. The polymer of claim 8 wherein said repeating unit is represented by the formula:

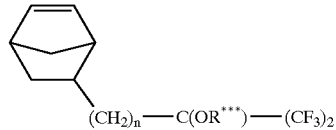

wherein n is an integer from 0 to 10 and R*** is as previously defined.

11. The method according to claim 1 where said incorporating comprises incorporating hydrogen and a hydrogenation catalyst.

12. The method according to claim 11 where said hydrogenation catalyst is selected from $H_2PtCl_4$, $RuHCl(Ph_3)_3$, $RhCl(Ph_3)_3$ or [Ir(1,5-cyclooctadiene)(P(cyclohexyl)$_3$)(pyridine)]$PF_6$.

13. The method according to claim 1 where said incorporating comprises incorporating a silane post-functionalization agent and a hydrosilation catalyst.

14. The method according to claim 13 where said hydrosilation catalyst is selected from $H_2PtCl_4$, $RuHCl(Ph_3)_3$, $RhCl(Ph_3)_3$ or [Ir(1,5-cyclooctadiene)(P(cyclohexyl)$_3$)(pyridine)]$PF_6$ and said silane post-functionalization agent comprises a ($C_1$–$C_{10}$) trialkyl silane or pentamethyldisiloxane.

15. The method of claim 1 where said polymer comprises a vinyl addition polymer.

16. The method of claim 1 where said polycyclic repeating units are represented by at least one of the following formulae:

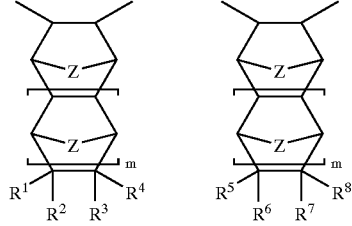

whore $R_1$ to $R^4$ independently represent hydrogen, linear or branched ($C_1$ to $C_3$) alkyl, linear and branched ($C_1$ to $C_{24}$) halohydrocarbyl, linear or branched ($C_2$ to $Ca_{30}$) olefin; —$(CH_2)_n$—$C(O)OR^*$, —$(CH_2)_n$—$C(O)OR$, —$(CH_2)_n$—$OR$, —$(CH_2)_n$—$OC(O)R$, —$(CH_2)_n$—$C(O)R$, —$(CH_2)_n$—$OC(O)OR$, —$(CH_2)_n$—$C(R)_2$—$CH(R)(C(O)OR^{})$, —$(CH_2)_n$—$(CR_2)_n$—$CH(R)(C(O)OR^{})$, —$(CH_2)_n$—$C(OR^{*})$—$(CF_3)_2$, —$(CR'_2)_n$—O—R— and —$(CH_2)_nC(R)_2$—$CH(C(O)OR^{})_2$; where R represents hydrogen, linear and branched ($C_1$ to $C_{10}$) alkyl; R' represents hydrogen or a halogen; R* represents an acid labile moiety; R** independently represents R or R*; R*** represents —$CH_2OR$, —$C(O)OR$ or —$C(O)R$; n is an integer from 0 to 10; m is an integer from 0 to 5; and Z represents —$(CH_2)_p$—, oxygen, sulfur, or —NH— and p is equal to 1 or 2; and where $R^5$ to $R^8$ independently represent hydrogen, linear or branched ($C_1$ to $C_{30}$) alkyl, linear or branched ($C_2$ to $C_{30}$) olefin; —$(CH_2)_n$—$C(O)OR^*$, —$(CH_2)_n$—$C(O)OR$, —$(CH_2)_n$—$OR$, —$(CH_2)_n$—$OC(O)R$, —$(CH_2)_n$—$C(O)R$, —$(CH_2)_n$—$OC(O)OR$, —$(CH_2)_n$—$C(R)_2$—$CH(R)(C(O)OR^{})$, —$(CH_2)_n$—$(CR_2)_n$—$CH(R)(C(O)OR^{})$, —$(CR'_2)_n$—O—R— and —$(CH_2)_n$—$C(R)_2CH(C(O)OR^{**})_2$; where R represents hydrogen, linear and branched ($C_1$ to $C_{10}$) alkyl, —$(CH_2)_s$— where s an integer from 1 to 10; Z including p, R', R*, R**, n and m are as defined above, with the proviso that one of $R^1$ to $R^8$ must represent an acid labile moiety.

17. The polymer of claim 16 where Z is methylene.

18. The polymer of claim 17 where at least one of $R^1$ to $R^8$ is selected from the group represented by the formula $-CH_2)_n-C(O)OR^*$.

19. The polymer of claim 18 where at least one of $R^1$ to $R^4$ is a halohydrocarbyl group represented by the formula $C_rX''_{2r+1}$ wherein X" is independently selected from fluorine, chlorine, bromine and iodine, end r is an integer from 1 to 20.

20. The polymer of claim 18 where said repeating unit is represented by the formula:

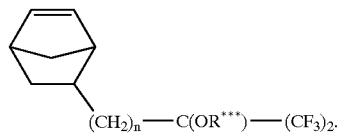

* * * * *